United States Patent
Rha et al.

(10) Patent No.: US 9,953,924 B2
(45) Date of Patent: *Apr. 24, 2018

(54) SEMICONDUCTOR DEVICES INCLUDING A CAPPING LAYER

(71) Applicant: Samsung Electronics Co., Ltd., Suwon-si, Gyeonggi-do (KR)

(72) Inventors: Sangho Rha, Seongnam-si (KR); Jongmin Baek, Suwon-si (KR); Wookyung You, Suwon-si (KR); Sanghoon Ahn, Goyang-si (KR); Nae-In Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/618,811

(22) Filed: Jun. 9, 2017

(65) Prior Publication Data

US 2017/0278797 A1 Sep. 28, 2017

Related U.S. Application Data

(63) Continuation of application No. 15/155,539, filed on May 16, 2016, now Pat. No. 9,711,453, which is a (Continued)

(30) Foreign Application Priority Data

Aug. 1, 2013 (KR) .................. 10-2013-0091685

(51) Int. Cl.
*H01L 23/528* (2006.01)
*H01L 21/768* (2006.01)
(Continued)

(52) U.S. Cl.
CPC ...... *H01L 23/5283* (2013.01); *H01L 21/0228* (2013.01); *H01L 21/02178* (2013.01);
(Continued)

(58) Field of Classification Search
CPC ......... H01L 21/76834; H01L 21/76832; H01L 21/306
See application file for complete search history.

(56) References Cited

U.S. PATENT DOCUMENTS

| 6,908,829 B2 | 6/2005 | Hussein et al. |
| 6,995,073 B2 | 2/2006 | Liou |

(Continued)

FOREIGN PATENT DOCUMENTS

| JP | 2007-188919 | 7/2007 |
| JP | 2012-049290 | 3/2012 |

(Continued)

*Primary Examiner* — Karen Kusumakar
(74) *Attorney, Agent, or Firm* — Ward and Smith, P.A.

(57) ABSTRACT

Methods of forming a semiconductor device are provided. A method of forming a semiconductor device may include forming a capping layer on a metal pattern and on an adjacent portion of an insulating layer, the capping layer comprising a first etch selectivity, with respect to the insulating layer, on the metal pattern and a second etch selectivity, with respect to the insulating layer, on the portion of the insulating layer. Moreover, the method may include forming a recess region adjacent the metal pattern by removing the capping layer from the portion of the insulating layer. At least a portion of the capping layer may remain on an uppermost surface of the metal pattern after removing the capping layer from the portion of the insulating layer. Related semiconductor devices are also provided.

20 Claims, 33 Drawing Sheets

Related U.S. Application Data continuation of application No. 14/284,674, filed on May 22, 2014, now Pat. No. 9,368,362.

(51) Int. Cl.

| | |
|---|---|
| *H01L 21/321* | (2006.01) |
| *H01L 23/522* | (2006.01) |
| *H01L 21/02* | (2006.01) |
| *H01L 23/532* | (2006.01) |
| *H01L 21/288* | (2006.01) |
| *H01L 21/306* | (2006.01) |

(52) U.S. Cl.
CPC ...... *H01L 21/02274* (2013.01); *H01L 21/288* (2013.01); *H01L 21/306* (2013.01); *H01L 21/3212* (2013.01); *H01L 21/7682* (2013.01); *H01L 21/7684* (2013.01); *H01L 21/76802* (2013.01); *H01L 21/76826* (2013.01); *H01L 21/76829* (2013.01); *H01L 21/76832* (2013.01); *H01L 21/76834* (2013.01); *H01L 21/76843* (2013.01); *H01L 21/76849* (2013.01); *H01L 21/76871* (2013.01); *H01L 21/76877* (2013.01); *H01L 23/5222* (2013.01); *H01L 23/5226* (2013.01); *H01L 23/5329* (2013.01); *H01L 23/53238* (2013.01); *H01L 23/53295* (2013.01); *H01L 21/76885* (2013.01); *H01L 2924/0002* (2013.01)

(56) References Cited

U.S. PATENT DOCUMENTS

| | | | |
|---|---|---|---|
| 7,741,228 | B2 | 6/2010 | Ueki et al. |
| 8,053,356 | B2 | 11/2011 | Chang et al. |
| 8,084,352 | B2 | 12/2011 | Harada et al. |
| 2002/0043673 | A1 | 4/2002 | Tamaoka |
| 2004/0058547 | A1 | 3/2004 | Morrow et al. |
| 2004/0188846 | A1 | 9/2004 | Hamada |
| 2006/0281298 | A1* | 12/2006 | Noguchi ............ H01L 21/76811 438/622 |
| 2008/0124917 | A1 | 5/2008 | Oh et al. |
| 2009/0079083 | A1 | 3/2009 | Yang |
| 2010/0133648 | A1 | 6/2010 | Seidel et al. |
| 2011/0201198 | A1 | 8/2011 | Jung et al. |
| 2011/0260326 | A1 | 10/2011 | Clevenger et al. |
| 2012/0280398 | A1 | 11/2012 | Clevenger et al. |
| 2012/0319279 | A1 | 12/2012 | Isobayashi |
| 2013/0320544 | A1 | 12/2013 | Lin et al. |

FOREIGN PATENT DOCUMENTS

| | | |
|---|---|---|
| KR | 10-2002-0011476 A | 2/2002 |
| KR | 10-2005-0056386 A | 6/2005 |
| KR | 10-0829603 B1 | 5/2008 |

\* cited by examiner

SEMICONDUCTOR DEVICES INCLUDING A CAPPING LAYER

CROSS-REFERENCE TO RELATED APPLICATION

This U.S. non-provisional patent application is a continuation of U.S. patent application Ser. No. 15/155,539, filed on May 16, 2016, which is a continuation of U.S. patent application Ser. No. 14/284,674, filed on May 22, 2014 (now U.S. Pat. No. 9,368,362) and claims priority under 35 U.S.C. § 119 to Korean Patent Application No. 10-2013-0091685, filed on Aug. 1, 2013, in the Korean Intellectual Property Office, the entire contents of which are hereby incorporated herein by reference.

BACKGROUND

Example embodiments of the present inventive concepts relate to semiconductor devices and methods of forming semiconductor devices. As integrated circuits are developed, semiconductor devices capable of high speed operation and high integration may be desired. In an attempt to provide high speed operation and high integration, a semiconductor device having a line width of a several tens of nanometers has been developed and commercialized. However, the reduction in critical dimension (CD) of semiconductor devices may result in an increase in electrical resistance of interconnection lines and an increasing capacitive coupling between the interconnection lines, and it may thus be difficult to realize high speed operation of semiconductor devices.

SUMMARY

Various embodiments of the present inventive concepts provide a method of forming a semiconductor device. The method may include forming a capping layer on a metal pattern and on an adjacent exposed portion of an insulating layer. The capping layer may include a first etch selectivity, with respect to the insulating layer, on the metal pattern. Moreover, the capping layer may include a second etch selectivity, with respect to the insulating layer, on the exposed portion of the insulating layer. The method may include forming a recess region adjacent the metal pattern by removing the capping layer from the exposed portion of the insulating layer. At least a portion of the capping layer may remain on an uppermost surface of the metal pattern after removing the capping layer from the exposed portion of the insulating layer.

In various embodiments, the capping layer may include a metallic element. Moreover, forming the capping layer may include simultaneously forming the capping layer that includes the metallic element on the metal pattern and on the exposed portion of the insulating layer. In some embodiments, the insulating layer may be a first insulating layer, and the method may include forming a second insulating layer on the at least the portion of the capping layer that remains on the uppermost surface of the metal pattern after removing the capping layer from the exposed portion of the first insulating layer, where a void in the recess region may underly the second insulating layer.

According to various embodiments, forming the second insulating layer may include forming the second insulating layer in the recess region such that the second insulating layer defines the void in the recess region. Alternatively, the second insulating layer may include a porous insulating layer, and the method may include forming the void in the recess region by: forming a sacrificial layer in the recess region; forming the porous insulating layer on the sacrificial layer; and removing the sacrificial layer through pores of the porous insulating layer.

In various embodiments, the first insulating layer may include first and second regions, and forming the capping layer may include forming the capping layer on the first and second regions of the first insulating layer. Moreover, the method may include forming a mask pattern on the capping layer on the second region of the first insulating layer. Forming the recess region may include forming the recess region in the first region of the first insulating layer, after forming the mask pattern. At least a portion of the capping layer may remain on second region of the first insulating layer after forming the recess region in the first region of the first insulating layer.

According to various embodiments, forming the mask pattern may include forming the mask pattern on at least a portion of capping layer on the first region of the first insulating layer. The capping layer may extend from the uppermost surface of the metal pattern onto an adjacent uppermost surface of the first region of the first insulating layer, after forming the recess region. The uppermost surface of the first region of the first insulating layer onto which the capping layer extends may be adjacent a first side of the metal pattern, and the void may be adjacent a second side of the metal pattern. Moreover, the metal pattern may include a closest metal pattern, among a plurality of metal patterns on the first region of the first insulating layer, to the second region.

In various embodiments, the void may be a first void underlying the second insulating layer and overlying the first region of the first insulating layer. The semiconductor device may include a second void underlying the second insulating layer and overlying the first region of the first insulating layer. The second void may be adjacent a first side of the metal pattern. The first void may be adjacent a second side of the metal pattern. The first and second voids may include first and second widths, respectively, and the second width may be wider than the first width. Moreover, the second void may be closer than the first void to the second region.

According to various embodiments, a surface of the exposed portion of the insulating layer may include dangling bonds. In some embodiments, the dangling bonds may include at least one of silicon hydroxide (Si—OH) bonds and silicon-hydrogen (Si—H) bonds on the surface of the exposed portion of the insulating layer. Moreover, the method may include forming the metal pattern and exposing the insulating layer to provide the exposed portion of the insulating layer, by planarizing a metal layer. In some embodiments, exposing the insulating layer by planarizing the metal layer may form dangling bonds on a surface of the exposed portion of the insulating layer.

In various embodiments, forming the capping layer on the metal pattern and on the adjacent exposed portion of the insulating layer may include forming a first portion of the capping layer on the metal pattern and a second portion of the capping layer on the adjacent exposed portion of the insulating layer. The first and second portions of the capping layer may include different first and second chemical compositions, respectively, that depend on underlying first and second materials in the metal pattern and in the insulating layer, respectively. In some embodiments, the insulating layer may include a dielectric layer, and the capping layer may include a variable-composition capping layer including the first and second portions that include the different first and second chemical compositions, respectively. The first chemical composition of the first portion of the variable-composition capping layer may include a metal nitride, and the second chemical composition of the second portion of the variable-composition capping layer may include a metal oxynitride.

A method of forming a semiconductor device, according to various embodiments, may include simultaneously forming a first portion of a capping layer on a metal pattern and a second portion of the capping layer on a dielectric layer adjacent the metal pattern. The second portion of the capping layer may include a lower etch selectivity than the first portion of the capping layer, with respect to the dielectric layer. Moreover, the method may include forming a recess region adjacent the metal pattern by removing the second portion of the capping layer from the dielectric layer and by recessing the dielectric layer. The first portion of the capping layer may at least partially remain on an uppermost surface of the metal pattern after removing the second portion of the capping layer from the dielectric layer.

In various embodiments, the first and second portions of the capping layer may include different first and second chemical compositions, respectively, that depend on underlying first and second materials in the metal pattern and in the dielectric layer, respectively. In some embodiments, the capping layer may be a variable-composition capping layer that includes the first and second portions that include the different first and second chemical compositions, respectively. Moreover, the first chemical composition of the first portion of the variable-composition capping layer may include a metal nitride, and the second chemical composition of the second portion of the variable-composition capping layer include a metal oxynitride.

According to various embodiments, the metal nitride of the first portion of the variable-composition capping layer may include aluminum nitride, and the metal oxynitride of the second portion of the variable-composition capping layer may include aluminum oxynitride. Moreover, forming the variable-composition capping layer may include: performing a plasma treatment on the dielectric layer and on the metal pattern; performing a purge process using an inert gas, after performing the plasma treatment; providing a metal source gas to the dielectric layer and to the metal pattern, after performing the purge process; and providing a nitrogen source gas to the dielectric layer and to the metal pattern, after providing the metal source gas.

In various embodiments, removing the second portion of the capping layer from the dielectric layer and recessing the dielectric layer may include etching the second portion of the capping layer and etching the dielectric layer. Moreover, recessing the dielectric layer may include forming a preliminary recess region by partially recessing the dielectric layer. In some embodiments the method may include forming a protection layer in the preliminary recess region, on the capping layer, and on a portion of a sidewall of the metal pattern.

According to various embodiments, forming the recess region may include recessing lowermost portions of the protection layer in the preliminary recess region and recessing portions of the dielectric layer underlying the lowermost portions of the protection layer. Moreover, the protection layer may at least partially remain on an uppermost surface of the capping layer, after recessing the lowermost portions of the protection layer in the preliminary recess region and after recessing the portions of the dielectric layer underlying the lowermost portions of the protection layer. In some embodiments, the protection layer may include a first protection layer, and the method may include forming a second protection layer in the recess region after recessing the lowermost portions of the protection layer in the preliminary recess region and after recessing the portions of the dielectric layer underlying the lowermost portions of the protection layer. Moreover, the method may include recessing lowermost portions of the second protection layer in the recess region and recessing portions of the dielectric layer underlying the lowermost portions of the second protection layer. In some embodiments, a first thickness of the capping layer and the protection layer on the capping layer may be thicker than a second thickness of the protection layer on the portion of the sidewall of the metal pattern.

In various embodiments, the method may include forming an insulating layer on the first portion of the capping layer on the uppermost surface of the metal pattern after removing the second portion of the capping layer from the dielectric layer. A void in the recess region may underlie the insulating layer. Moreover, forming the insulating layer may include forming the insulating layer in the recess region such that the insulating layer defines the void in the recess region. In some embodiments, the method may include forming an insulating layer on the first portion of the capping layer on the uppermost surface of the metal pattern after removing the second portion of the capping layer from the dielectric layer. In some embodiments, a void in the recess region may underlie the insulating layer, and the insulating layer may include a porous insulating layer. Moreover, the method may include forming the void in the recess region by: forming a sacrificial layer in the recess region; forming the porous insulating layer on the sacrificial layer; and removing the sacrificial layer through pores of the porous insulating layer.

A semiconductor device, according to various embodiments, may include a dielectric layer and a metal pattern adjacent the dielectric layer. Moreover, the semiconductor device may include a variable-composition capping layer that includes a first portion including a first chemical composition on the metal pattern and a second portion including a second chemical composition on the dielectric layer. The second chemical composition of the variable-composition capping layer may include a lower etch selectivity than the first chemical composition of the variable-composition capping layer, with respect to the dielectric layer.

In various embodiments, the first chemical composition of the first portion of the variable-composition capping layer may include a metal nitride, and the second chemical composition of the second portion of the variable-composition capping layer may include a metal oxynitride. In some embodiments, the metal nitride of the first portion of the variable-composition capping layer may include aluminum nitride, and the metal oxynitride of the second portion of the variable-composition capping layer may include aluminum oxynitride. Moreover, in some embodiments, the metal pattern may include copper.

According to various embodiments, the dielectric layer may include first and second regions. The variable-composition capping layer may be on the first region of the dielectric layer, and the metal pattern may include a first metal pattern on the first region of the dielectric layer. Moreover, the semiconductor device may include a second metal pattern on the second region of the dielectric layer; a capping layer on the second metal pattern; an insulating layer on the capping layer and on the variable-composition capping layer; and a void that underlies the insulating layer, overlies the second region of the dielectric layer, and is adjacent the second metal pattern. According to some embodiments, the semiconductor device may include a third metal pattern that overlies the first region of the dielectric layer and that penetrates the insulating layer and the first portion of the variable-composition capping layer on the first metal pattern. In some embodiments, the dielectric layer may be a first dielectric layer, the semiconductor device may include a second dielectric layer on the insulating layer, and the third metal pattern may include a portion that is in the second dielectric layer. In some embodiments, the variable-composition capping layer may be a first variable-composition capping layer, and the semiconductor device may include a second variable-composition capping layer that includes a first portion including the first chemical composition on the third metal pattern, and a second portion including the second chemical composition on the second dielectric layer, the second chemical composition of the second variable-composition capping layer having a lower etch selectivity than the first chemical composition of the second variable-composition capping layer, with respect to the second dielectric layer. In some embodiments, a first distance between the first metal pattern and an adjacent metal pattern on the first region of the first dielectric layer may be longer than a second distance between the second metal pattern and an adjacent metal pattern on the second region of the first dielectric layer, the semiconductor device may include a fourth metal pattern overlying the second region of the first dielectric layer, the void that overlies the second region of the first dielectric layer may be a first void, and the semiconductor device may include a second void adjacent the fourth metal pattern.

In various embodiments, the first chemical composition of the first portion of the variable-composition capping layer may include a metal nitride, and the second chemical composition of the second portion of the variable-composition capping layer may include a metal oxynitride. Moreover, the capping layer on the second metal pattern may include the metal nitride. In some embodiments, the semiconductor device may include a protection layer on the capping layer and on a sidewall of the second metal pattern. In some embodiments, a first thickness of the capping layer and the protection layer on the capping layer may be thicker than a second thickness of the protection layer on the sidewall of the second metal pattern.

According to various embodiments, the first and second regions of the dielectric layer may include a cell region and a peripheral circuit region, respectively. In some embodiments, the capping layer may extend from an uppermost surface of the second metal pattern onto an adjacent uppermost surface of the second region of the dielectric layer. Moreover, the uppermost surface of the second region of the dielectric layer onto which the capping layer extends may be adjacent a first side of the second metal pattern, and the void may be adjacent a second side of the second metal pattern. In some embodiments, the second metal pattern may be a closest metal pattern, among a plurality of metal patterns on the second region of the dielectric layer, to the first region.

In various embodiments, the void may include a first void underlying the insulating layer and overlying the second region of the dielectric layer, and the semiconductor device may include a second void underlying the insulating layer and overlying the second region of the dielectric layer. The second void may be adjacent a first side of the second metal pattern, and the first void may be adjacent a second side of the second metal pattern. Moreover, the first and second voids may include first and second widths, respectively, and the second width may be wider than the first width. In some embodiments, the second void may be closer than the first void to the first region.

BRIEF DESCRIPTION OF THE DRAWINGS

The above and other features and advantages of the disclosure will become more apparent in view of the attached drawings and accompanying detailed description.

Figure 1A:
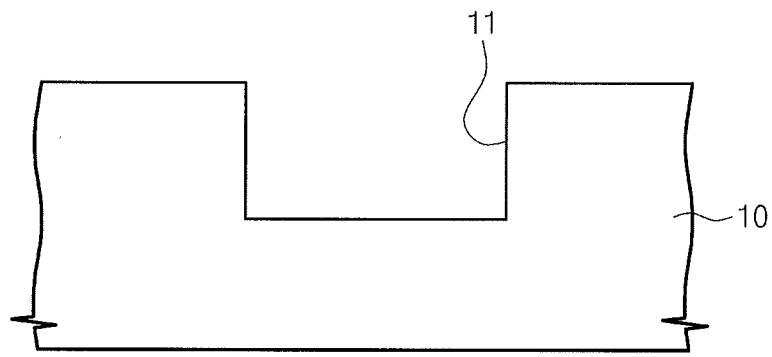
FIGS. 1A through 1D are sectional views illustrating a method of fabricating a semiconductor device, according to various example embodiments of the present inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout the description.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

It will be understood that although the terms "first," "second," etc. may be used herein to describe various elements, these elements should not be limited by these terms. These terms are only used to distinguish one element from another. Thus, a "first" element could be termed a "second" element without departing from the teachings of the present embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative turns are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein may be interpreted accordingly.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIGS. 1A through 1D are sectional views illustrating a method of fabricating a semiconductor device, according to various example embodiments of the present inventive concepts. Referring to FIG. 1A, a trench 11 may be formed in a low-k dielectric 10. Semiconductor devices (for example, transistors, capacitor and resistor) and lower interconnection lines (lower interconnections) may be provided below or in the low-k dielectric 10, and the trench 11 may be formed to expose a portion of the semiconductor devices. In example embodiments, the trench 11, in which a metal line 20 will be formed, may be formed by forming a mask pattern on the low-k dielectric 10 and anisotropically etching the low-k dielectric 10 using the mask pattern.

For example, the low-k dielectric 10 may be formed of a dielectric material, whose dielectric constant is lower than that of a silicon oxide layer, and include at least one layer. In example embodiment, the low-k dielectric 10 may be formed to have a dielectric constant of about 2.0 to 3.0 and include at least one of organic, inorganic, and organic-inorganic hybrid materials. Further, the low-k dielectric 10 may be formed to have a porous or non-porous property.

In some example embodiments, the low-k dielectric 10 may be formed of at least one of doped oxide materials (such as, fluorine-doped oxide, FSG, carbon-doped oxide, silicon oxide, hydrogen silsesquioxane (HSQ, SiO:H), methyl silsesquioxane (MSQ, SiO:CH3), or a-SiOC (SiOC:H)). In other example embodiments, the low-k dielectric 10 may be formed of at least one of low-k organic polymers, such as polyallylether resin, cyclic fluoroplastic, siloxane copolymer, polyallylether fluoride resin, polypentafluorostylene, polytetrafluorostylene resin, polyimide fluoride resin, polynaphthalene fluoride, or polycide resin.

Figure 1B:
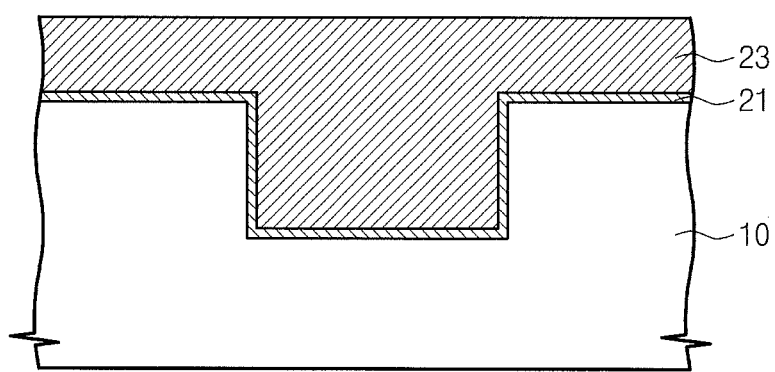

Referring to FIG. 1B, a barrier metal layer 21 and a metal layer 23 may be sequentially formed on the low-k dielectric 10 formed with the trench 11. The barrier metal layer 21 may be foamed with a uniform thickness to cover conformally the inner wall of the trench 11 and the top surface of the low-k dielectric 10. The barrier metal layer 21 may be formed of a conductive material capable of protecting/preventing the metal layer 23 from being diffused from the trench 11 into the low-k dielectric 10 adjacent thereto. For example, the barrier metal layer 21 may be formed of one of Ta, TaN, TaSiN, Ti, TiN, TiSiN, W, WN, or any combination thereof.

The metal layer 23 may be formed of a metallic material with low resistivity. For example, the metal layer 23 may be formed of copper or copper alloys. Here, the copper alloys may be copper compounds containing at least one of C, Ag, Co, Ta, In, Sn, Zn, Mn, Ti, Mg, Cr, Ge, Sr, Pt, Mg, Al, or Zr. The metal layer 23 may be formed using an electroplating or electroless plating method. In the case where the metal layer 23 is formed using the electroplating method, a seed layer may be formed on the surface of the barrier metal layer 21 to serve as nucleation sites at initial stage of the formation of metal layer 23. Accordingly, the metal layer 23 may have an improved uniformity. The seed layer may include at least one selected from the group consisting of, for example, Cu, Au, Ag, Pt, or Pd, in consideration of the plating process and the metal layer 23. As a result of the plating process, the metal layer 23 may be formed on the barrier metal layer 21 to fill the trench 11.

Figure 1C:
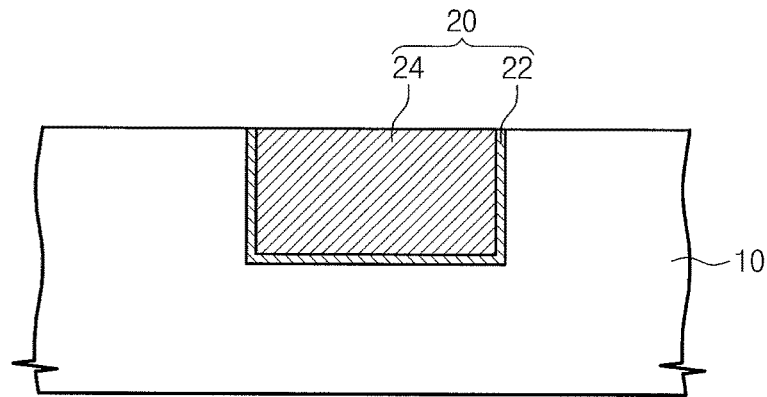

Referring to FIG. 1C, after the formation of the barrier metal layer 21 and the metal layer 23, a planarization process may be performed to expose the top surface of the low-k dielectric 10. In example embodiment, the planarization process may be performed using a chemical mechanical polishing (CMP) process. During the CMP process, the metal layer 23 may be mechanically polished using a polishing pad, which may be configured to rotate with respect to the metal layer 23, and in addition to the mechanical polishing, be chemically etched using a polishing solution with slurries, which may be supplied between the metal layer 23 and the polishing pad.

The planarization process may be performed in such a way that the metal layer 23 and the barrier metal layer 21 are planarized to form metal patterns 24 and barrier metal patterns 22, respectively. As a result of the planarization process, the metal line 20 including the barrier metal pattern 22 and the metal pattern 24 may be formed in the trench 11. The metal line 20 may be electrically connected to semiconductor devices (for example, transistors, capacitor and resistor) and/or lower interconnection lines.

Figure 1D:
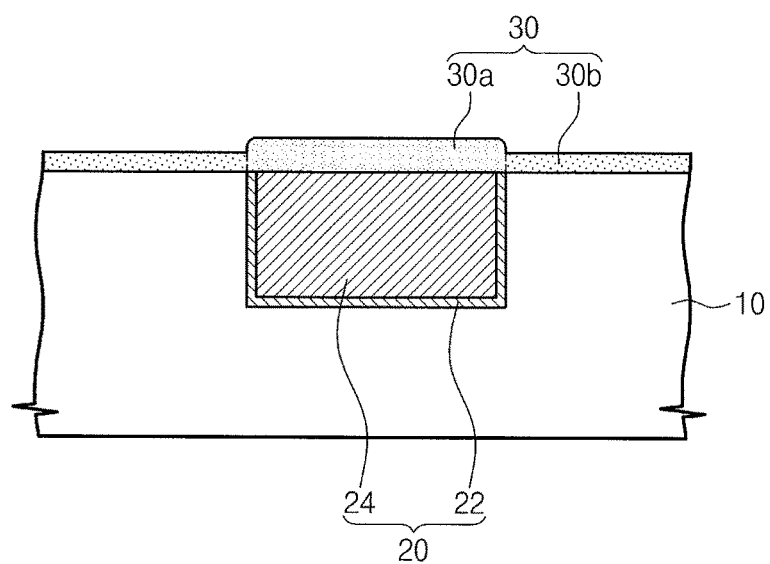

Referring to FIG. 1D, a capping layer 30 may be deposited on the planarized top surfaces of the low-k dielectric 10 and the metal line 20. The capping layer 30 may protect/prevent the metal line 20 from being damaged and etched in subsequent processes. In some example embodiments, the capping layer 30 may be formed using a plasma-enhanced atomic layer deposition (PEALD) process, as will be described in more detail with reference to FIGS. 2 and 3A through 3D. In some example embodiments, the capping layer 30 may be simultaneously deposited on the top surfaces of the low-k dielectric 10 and the metal line 20 and have chemical compositions depending on the material of the underlying layer. For example, the capping layer 30 may be formed of an insulating material that is different from the low-k dielectric 10. Further, a dielectric constant of the capping layer 30 may be greater than that of the low-k dielectric 10. In example embodiment, the insulating material for the capping layer 30 may be a metal insulating material containing a metallic element.

In some example embodiments, the capping layer 30 may be a variable-composition capping layer that includes a first portion 30a on the metal line 20 and a second portion 30b on the low-k dielectric 10, and the first portion 30a and the second portion 30b may have different chemical compositions from each other due to the different compositions of the underlying portions of the metal line 20 and the low-k dielectric 10. For example, the first portion 30a of the capping layer 30 may be formed to contain a metallic element and nitrogen, and the second portion 30b of the capping layer 30 may be formed to contain a metallic element and oxygen or a metallic element, nitrogen, and oxygen. In other words, the first portion 30a of the capping layer 30 may be formed of a metal nitride, and the second portion 30b of the capping layer 30 may be formed of a metal oxide or a metal oxynitride. Furthermore, in the case where the first portion 30a of the capping layer 30 contains a metallic element and nitrogen and the second portion 30b of the capping layer 30 contains a metallic element, nitrogen, and oxygen, a nitrogen content of the capping layer 30 may be higher in the first portion 30a than in the second portion 30b. In addition, an oxygen content of the second portion 30b of the capping layer 30 may decrease with increasing distance from the top surface of the low-k dielectric 10.

In some example embodiments, the first and second portions 30a and 30b of the capping layer 30 may have chemical compositions different from each other, thereby having an etch selectivity with respect to each other. In other words, when the capping layer 30 is etched in a dry or wet manner, the first and second portions 30a and 30b may exhibit etch rates different from each other. In example embodiments, when the capping layer 30 is etched in a dry or wet manner, the first and second portions 30a and 30b may have an etch selectivity (for example, a ratio in etch rate therebetween) ranging from about 2:1 to about 5:1.

In addition, depending on the underlying layer, the capping layer 30 may be formed to have a non-uniform thickness. In example embodiments, the first portion 30a of the capping layer 30 may be thicker than the second portion 30b of the capping layer 30. The thickness of the capping layer 30 may be selected to realize the etch selectivity between the first portion 30a and the second portion 30b. For example, the capping layer 30 may have a thickness of about 200 Å or lower.

In some example embodiments, the capping layer 30 may include a metal material that is different from the metal line 20. For example, in the case where the metal pattern 24 of the metal line 20 may include a first metal material, the capping layer 30 may include a second metal material that is different from the first metal material. In example embodiments, the metal pattern 24 of the metal line 20 may include copper or copper alloys. The capping layer 30 may include at least one selected from the group consisting of aluminum (Al), silicon (Si), titanium (Ti), tantalum (Ta), cobalt (Co), gallium (Ga), germanium (Ge), strontium (Sr), yttrium (Y), zirconium (Zr), niobium (Nb), ruthenium (Ru), indium (In), barium (Ba), lanthanum (La), hafnium (Hf), tantalum (Ta), tungsten (W), iridium (Ir), lead (Pb), and bismuth (Bi).

Figure 2:
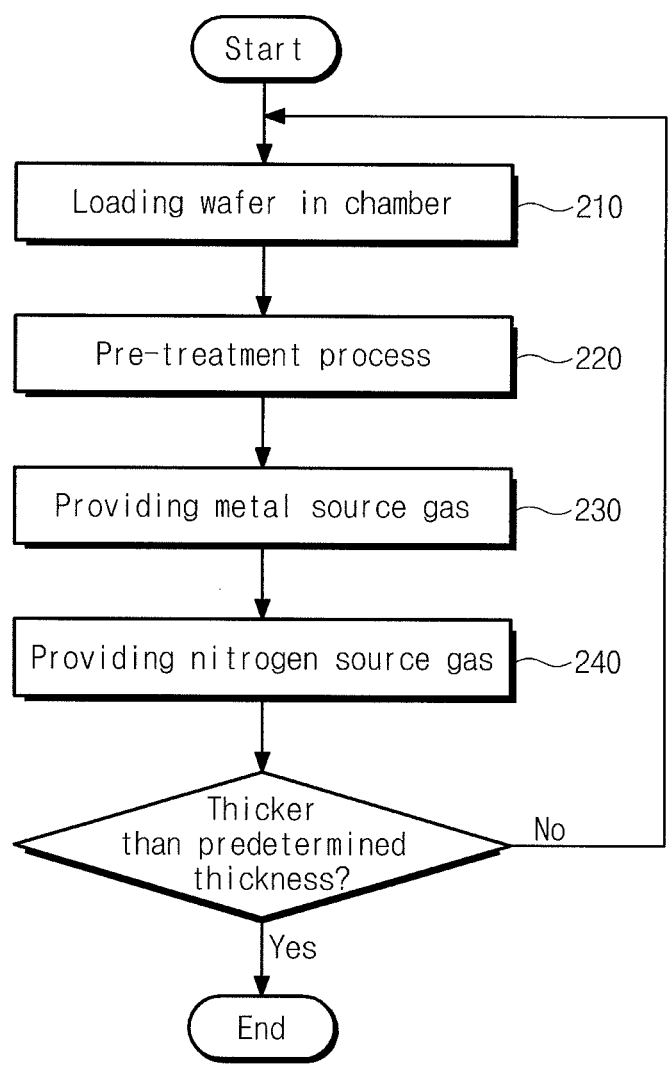
FIG. 2 is a flow chart illustrating a method of forming a capping layer of a semiconductor device, according to various example embodiments of the present inventive concepts.

FIG. 2 is a flow chart illustrating a method of forming a capping layer of a semiconductor device, according to example embodiments of the inventive concept. FIGS. 3A through 3D are sectional views illustrating a method of forming a capping layer of a semiconductor device, according to example embodiments of the inventive concept.

Figure 3A:
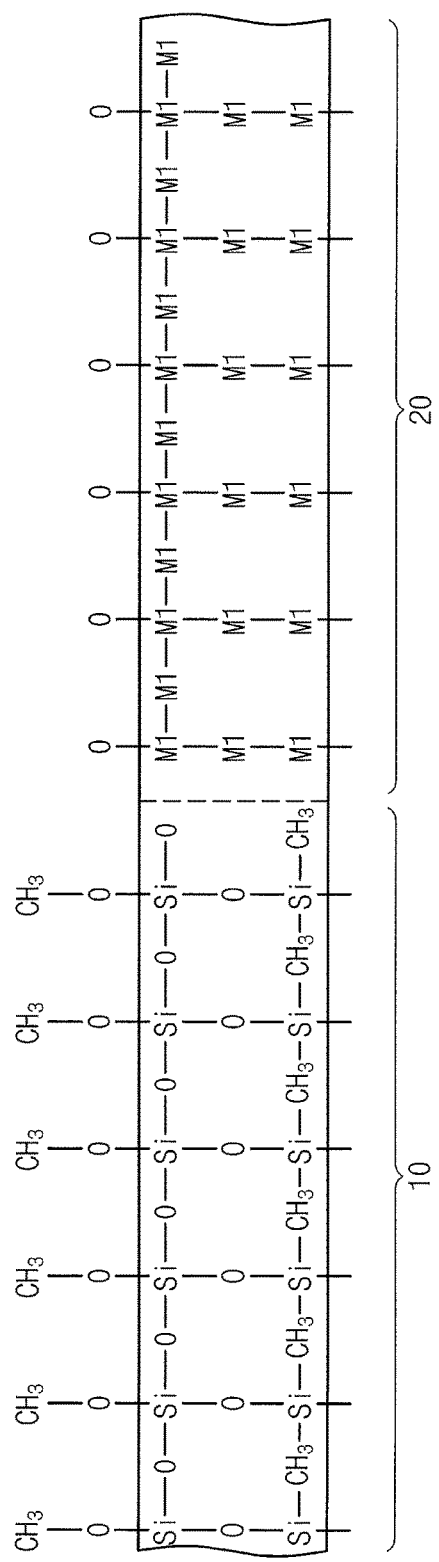
FIGS. 3A through 3D are sectional views illustrating a method of forming a capping layer of a semiconductor device, according to various example embodiments of the present inventive concepts.

Referring to FIGS. 2 and 3A, a wafer, on which the low-k dielectric 10 and the metal line 20 formed in the low-k dielectric 10 are provided, may be loaded in a chamber (in Block 210). As described with reference to FIGS. 1A through 1C, the etching and planarization processes may be performed on the low-k dielectric 10 to form the trench 11, and thus, the top surface of the low-k dielectric 10 may be damaged by such processes. For example, there are dangling bonds and defects on the top surface of the low-k dielectric 10. In other words, there may be Si—OH bonds and Si—H bonds on the surface of the low-k dielectric 10.

In some example embodiments, the low-k dielectric 10 may be formed of a doped oxide material containing CxHy (e.g., $CH_3$, $CH_2$, or CH) bonded with silicon. Further, the low-k dielectric 10 may be exposed to an organic compound, when the etching process and the planarization process may be performed to form the trench 11. For example, when the low-k dielectric 10 is etched, it may be exposed to etching gas containing at least one of CxHy (where x and y are integers higher than one) gas, inert gas, oxygen gas, and carbon dioxide gas. Accordingly, as shown in FIG. 3A, Si—OH and Si—H bonds on the top surface of the low-k dielectric 10 may be substituted by CxHy (e.g., $CH_3$, $CH_2$, or CH).

In some example embodiments, the metal line 20 may include or be formed of a first metallic element M1, which may be at least one selected from the group consisting of, for example, tungsten, copper, hafnium, zirconium, titanium, tantalum, aluminum, ruthenium, palladium, platinum, cobalt, nickel, and conductive metal nitrides. As described with reference to FIGS. 1A through 1C, the metal line 20 may be exposed to oxygen, which may be contained in the slurries of the planarization process, and thus, a metal oxide layer, in which a metallic element and oxygen are bonded, may be formed on the surface of the metal line 20. For example, in the case where the first metallic element M1 is copper (Cu), a copper oxide layer (e.g., of CuO of $Cu_2O$) may be formed.

Figure 3B:
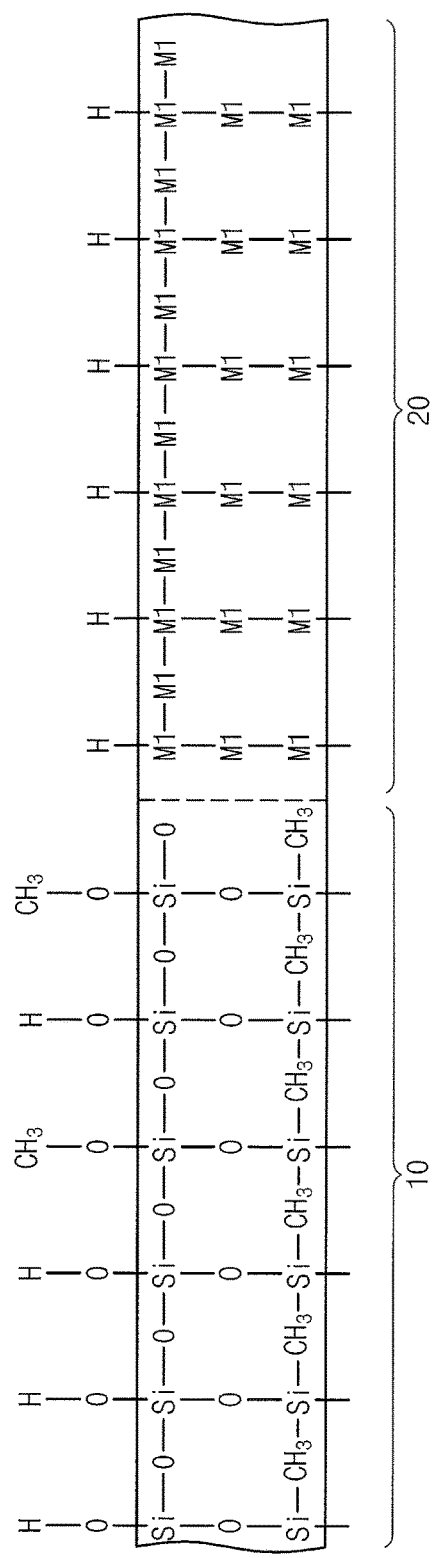

Referring to FIGS. 2 and 3B, a pre-treatment process may be performed to the top surfaces of the low-k dielectric 10 and the metal line 20 to facilitate the selective formation of the capping layer 30 (in Block 220). In some example embodiments, the pre-treatment process may be performed by a plasma treatment process using $Ar_2$, $N_2$, $H_2$, $NH_3$, or water vapor, a reactive precleaning process using hydrogen, an RF precleaning process, a pre-treatment process using ammonia, a thermal treatment process, or a UV treatment process. The pre-treatment process may contribute to increase hydroxyl group (—OH) to be bonded on the top surface of the low-k dielectric 10 and decrease bonds between the first metallic element M1 and oxygen (O) on the top surface of the metal line 20.

In some example embodiments, in the case where the pre-treatment process is performed by the plasma treatment process using $Ar_2$, $N_2$, $H_2$, $NH_3$, or water vapor, carbon on the surface of the low-k dielectric 10 may be depleted, and thus, Si—OH bonds may be increased on the surface of the low-k dielectric 10. At the same time, a metal oxide layer may be removed from the surface of the metal line 20, as a result of the plasma treatment. After the pre-treatment process, a purge process may be performed using inert gas (e.g., helium (He), neon (Ne), or argon (Ar)) or nitrogen ($N_2$) gas.

Figure 3C:
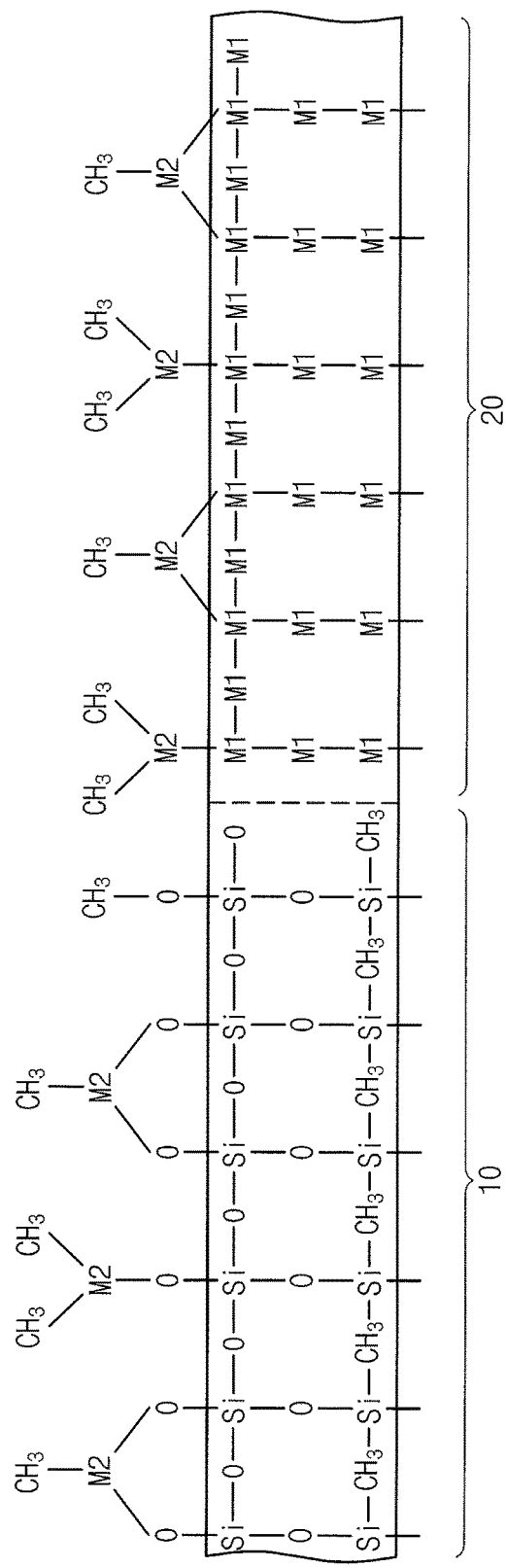

Referring to FIGS. 2 and 3C, metal source gas may be supplied on the surfaces of the low-k dielectric 10 and the metal line 20 (in Block 230). In some example embodiments, the metal source gas may contain a second metallic element M2 that is different from the first metallic element M1 for the metal line 20. For example, the second metallic element M2 may be selected from the group consisting of aluminum (Al), titanium (Ti), cobalt (Co), gallium (Ga), germanium (Ge), strontium (Sr), yttrium (Y), zirconium (Zr), niobium (Nb), ruthenium (Ru), indium (In), barium (Ba), lanthanum (La), hafnium (Hf), tantalum (Ta), tungsten (W), iridium (Ir), lead (Pb), and bismuth (Bi).

In some example embodiments, the metal source gas may include an aluminum precursor, which may be selected from the group consisting of, for example, trimethyl aluminum (TMA), triethyl aluminum (TEA), 1-methylpyrrolidine alane (MPA), dimethylethylamine alane (DMEAA), dimethyl aluminum hydride (DMAH), and trimethylaminealane borane (TMAAB).

In some embodiments, the metal source gas may include a titanium precursor, which may be selected from the group consisting of, for example, tetrakis(isopropoxide)(Ti(O-iProp)4), titanium halide, cyclopentadienyl titanium, titanium bis (isopropoxide)-bis(2,2,6,6-tetramethyl-3,5-heptanedionate) (Ti(O-iProp)2(thd)2), titanium bis(4-N-(2-methylethyoxy)imino-2-pentanoate) (Ti(2meip)2), titanium bis [4-(ethoxy)imino-2-pentanoate] (Ti(eip)2), and titanium bis [2,2-dimethyl-5-(2-methylethoxy) imino-3-heptanoate] (Ti (22dm2meih)2).

In still other example embodiments, the metal source gas may include a hafnium precursor, which may be selected from the group consisting of, for example, hafnium t-butoxide (HTB, $Hf(OtBu)_4$), tetrakis(diethylamido)hafnium (TDEAH, $Hf(NEt_2)_4$), tetrakis(ethylmethylamido)hafnium (TEMAH, $Hf(NEtMe)_4$), and tetrakis(dimethylamido)hafnium (TDMAH, $Hf(NMe_2)_4$).

Since the metal source gas containing the second metallic element M2 is provided, the second metallic element M2 may be adsorbed on the top surfaces of the low-k dielectric 10 and the metal line 20, after the pre-treatment process. For example, the metal source gas may be reacted with the hydroxyl group (—OH) on the top surface of the low-k dielectric 10, and thus, the second metallic element M2 may be bonded with oxygen (O) of the low-k dielectric 10. Accordingly, a metal oxide layer may be formed on the surface of the low-k dielectric 10. In addition, the second metallic element M2 may be bonded with the first metallic element M1, on the top surface of the metal line 20. After the adsorption of the second metallic element M2, the metal source gas may be purged from the surfaces of the low-k dielectric 10 and the metal line 20 using inert gas (e.g., helium (He), neon (Ne), or argon (Ar)) or nitrogen (N2) gas.

Figure 3D:
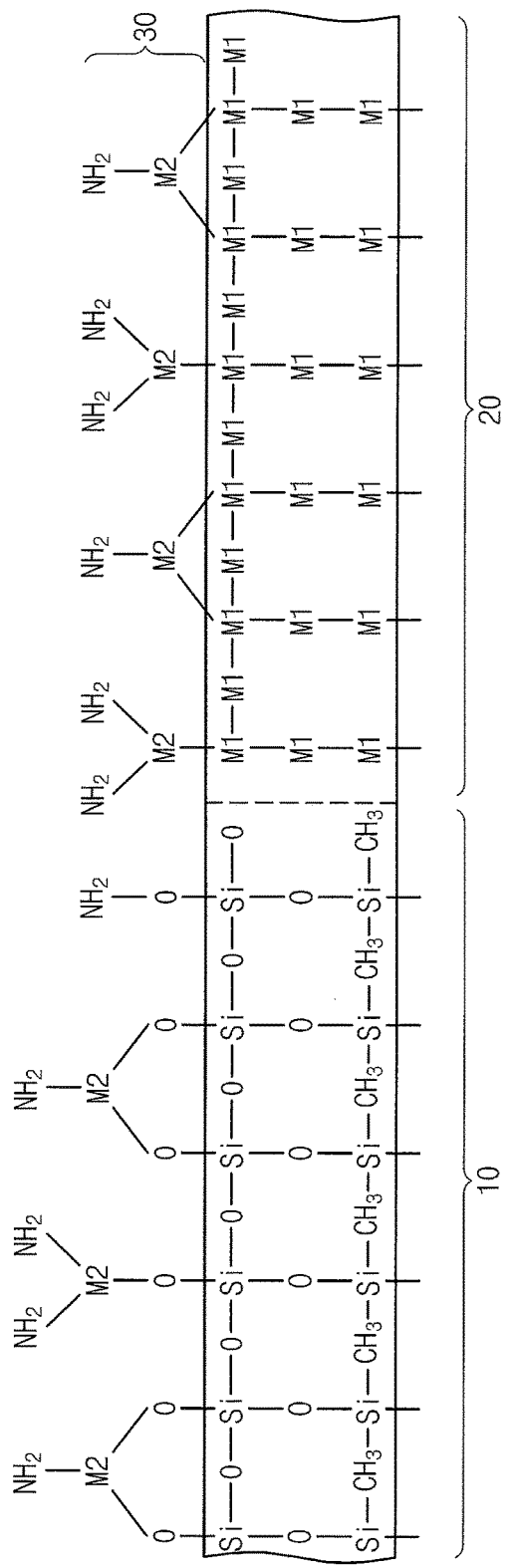

Referring to FIGS. 2 and 3D, nitrogen source gas may be provided on the top surfaces of the low-k dielectric 10 and the metal line 20 adsorbed with the second metallic element M2 (in Block 240). The nitrogen source gas may be, for example, nitrogen-containing gas, such as $N_2$, $NH_3$, $N_2O$ or NO, or mixture gas of the nitrogen-containing gas and halogen or oxygen gas. In example embodiment, the nitrogen source gas to be provided may be in plasma state.

The nitrogen source gas may react with the second metallic element M2, which may be adsorbed on the top surfaces of the low-k dielectric 10 and the metal line 20. Accordingly, a metal oxynitride layer may be formed on the surface of the low-k dielectric 10, and a metal nitride layer may be formed on the surface of the metal line 20. Thereafter, a purge process may be performed using inert gas (e.g., helium (He), neon (Ne), or argon (Ar)) or nitrogen (N2) gas to remove an unreacted part of the nitrogen source gas.

In some example embodiments, the pre-treatment process (Block 220), the providing of the metal source gas (Block 230), and the providing of the nitrogen source gas (Block 240) may be sequentially repeated, until the capping layer 30 has a predetermined thickness. Alternatively, after performing the pre-treatment process (Block 220) one time, the providing of the metal source gas (Block 230) and the providing of the nitrogen source gas (Block 240) may be alternatingly repeated, until the capping layer 30 has a predetermined thickness.

During the repetition of the processes, the metal source gas may be reacted with oxygen in the low-k dielectric 10 or with the nitrogen source gas, thereby forming the capping layer 30 on the top surface of the low-k dielectric 10, and the metallic element may be reacted with nitrogen, thereby forming the capping layer 30 on the top surface of the metal line 20. In other words, the capping layer 30 may be a variable-composition capping layer that includes a first composition (e.g., including the metallic element, oxygen, and nitrogen) on the top surface of the low-k dielectric 10 and a second composition (e.g., including the metallic element and nitrogen) on the top surface of the metal line 20. Here, a nitrogen content of the capping layer 30 may be lower on the low-k dielectric 10 than on the metal line 20.

In addition, the capping layer 30 on the top surface of the low-k dielectric 10 may be formed by the reaction with oxygen atoms in the low-k dielectric 10, and thus, when the capping layer 30 has an increased thickness on the low-k dielectric 10, an amount of oxygen atoms that can be reacted with the metal source gas may be decreased. Accordingly, the oxygen concentration of the capping layer 30 may decrease with increasing distance from the top surface of the low-k dielectric 10.

Figure 4:
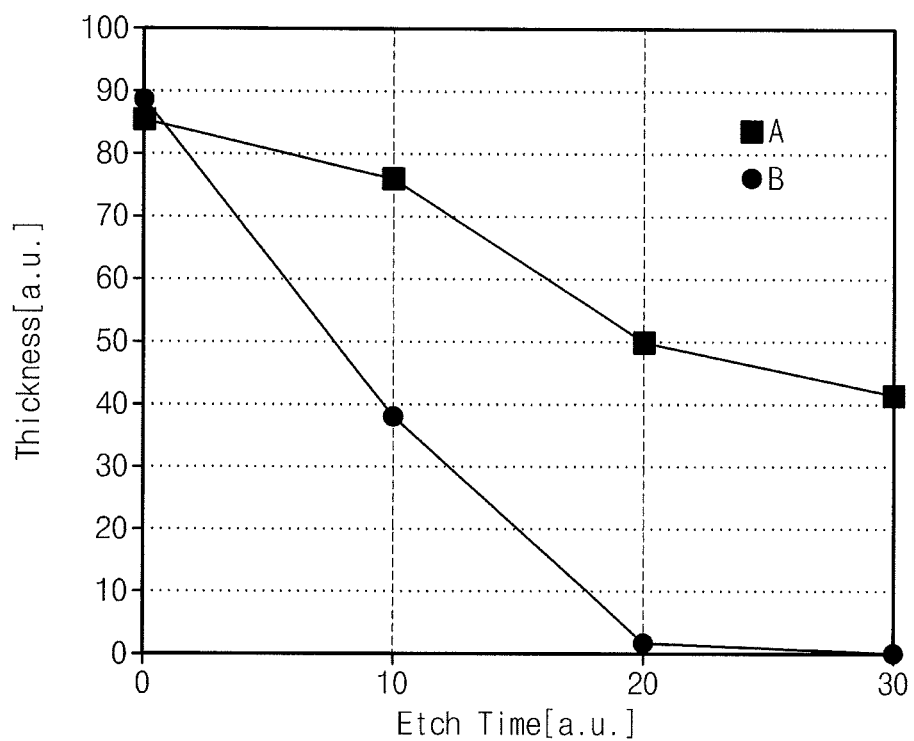
FIG. 4 is a graph showing a selective etching property of a capping layer according to various example embodiments of the present inventive concepts.

FIG. 4 is a graph showing a selective etching property of a capping layer according to example embodiments of the inventive concept. As described with reference to FIGS. 2 and 3A through 3D, the pre-treatment process (Block 220), the providing of the metal source gas (Block 230), and the providing of the nitrogen source gas (Block 240) were repeated to form the capping layer 30 on the top surfaces of the low-k dielectric 10 and the metal line 20, as shown in FIG. 1D. Here, NH$_3$ plasma treatment process was performed as the pre-treatment process, an aluminum precursor was used for the metal source gas, and NH$_3$ was used for the nitrogen source gas in the plasma treatment process. As a result, the first portion 30a of the capping layer 30 may contain aluminum nitride, and the second portion 30b of the capping layer 30 may contain aluminum oxide and aluminum oxynitride. Thereafter, the capping layer 30 was wet-etched using diluted HF etching solution. FIG. 4 shows a variation in thickness of the capping layer 30 over an etch time.

In FIG. 4, a graph A represents a variation in thickness of the capping layer 30 on the metal line 20 and a graph B represents a variation in thickness of the capping layer 30 on the low-k dielectric 10. According to the experimental result, in the wet-etching process using HF etching solution, an etch rate of the capping layer 30 on the metal line 20 may be different from that on the low-k dielectric 10. For example, according to example embodiments of the inventive concept, a ratio in etch rate (i.e., etch selectivity) of the second portion 30b to the first portion 30a ranges from about 2:1 to about 5:1.

FIGS. 5 through 11 are sectional views illustrating a method of fabricating a semiconductor device, according to various example embodiments of the present inventive concepts. FIGS. 12 through 15 are sectional views illustrating methods of fabricating a semiconductor device, according to modifications of various example embodiments of the present inventive concepts.

Figure 5:
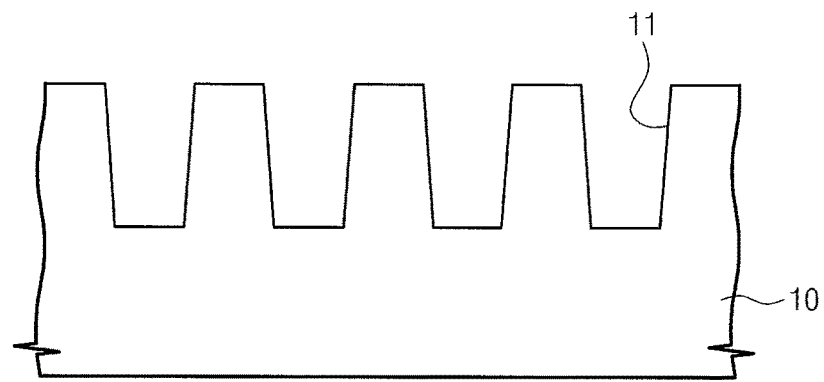
FIGS. 5 through 11 are sectional views illustrating a method of fabricating a semiconductor device, according to various example embodiments of the present inventive concepts.

Referring to FIG. 5, the low-k dielectric 10 including the trenches 11 may be formed on a lower layer provided with semiconductor devices. The lower layer disposed below the low-k dielectric 10 may include a semiconductor substrate, semiconductor devices (for example, MOS transistors, capacitor and resistor) formed on the semiconductor substrate, at least one insulating layer covering the semiconductor devices, lower interconnection lines electrically connected to the semiconductor devices. The low-k dielectric 10 may be formed using a plasma-enhanced chemical vapor deposition (PECVD) or spin-on-coating process.

In some example embodiments, the low-k dielectric 10 may be formed of at least one of doped oxide materials (such as, fluorine-doped oxide, FSG, carbon-doped oxide, silicon oxide, hydrogen silsesquioxane (HSQ, SiO:H), methyl silsesquioxane (MSQ, SiO:CH3), or a-SiOC (SiOC:H)). In some embodiments, the low-k dielectric 10 may be formed of at least one of low-k organic polymers, such as polyalylether resin, cyclic fluoroplastic, siloxane copolymer, polyallylether fluoride resin, polypentafluorostylene, polytetrafluorostylene resin, polyimide fluoride resin, polynaphthalene fluoride, or polycide resin.

In a subsequent process, the metal lines 20 will be formed in the trenches 11, respectively, and thus, the width of and space between the trenches 11 may have dimensions capable of satisfying a desired line width of semiconductor device and a desired capacitance between the metal lines 20. The formation of the trenches 11 may include forming a mask pattern on the low-k dielectric 10, and anisotropically etching the low-k dielectric 10 using the mask pattern as an etch mask.

Figure 6:
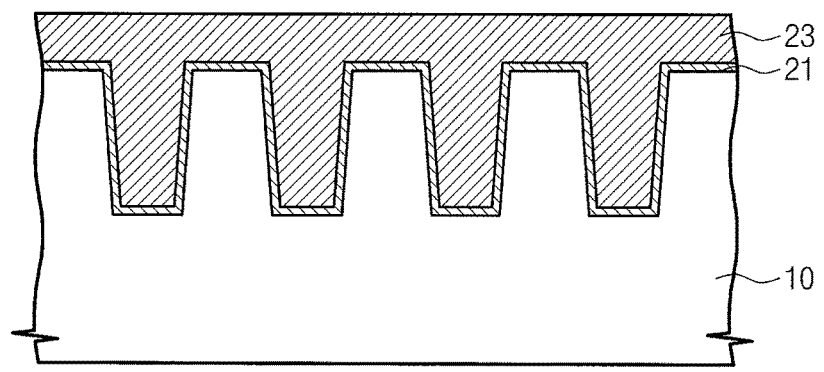

Referring to FIG. 6, the barrier metal layer 21 and the metal layer 23 may be sequentially formed on the low-k dielectric 10 provided with the trenches 11. The barrier metal layer 21 may be formed to cover conformally the bottom and side surfaces of the trenches 11. The barrier metal layer 21 may be formed of a material capable of protecting/preventing the metal layer 23 to be buried in the trenches 11 from being diffused into the low-k dielectric 10 adjacent thereto. For example, the barrier metal layer 21 may be formed of at least one of Ta, TaN, TaSiN, Ti, TiN, TiSiN, W, WN, or any combination thereof. In addition, the barrier metal layer 21 may be formed to have a thickness of about 5 Å to about 50 Å. The barrier metal layer 21 may be formed using a chemical vapor deposition (CVD), an atomic layer deposition (ALD), or a physical vapor deposition (PVD) (such as sputtering).

Next, the metal layer 23 may be formed on the barrier metal layer 21 to fill the trenches 11. In some example embodiments, the metal layer 23 may be formed of copper or copper alloys. Here, the copper alloys may be copper compounds containing at least one of C, Ag, Co, Ta, In, Sn, Zn, Mn, Ti, Mg, Cr, Ge, Sr, Pt, Mg, Al, or Zr.

Similar to the embodiments previously described herein, the metal layer 23 may be formed using an electroplating or electro-less plating method. As a result of the plating method, the metal layer may be formed on the low-k dielectric 10 to fill the trenches 11.

Figure 7:
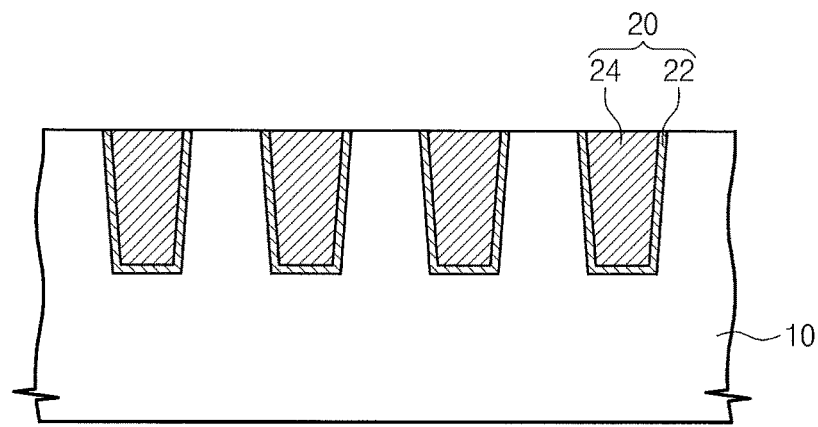

Referring to FIG. 7, a planarization process may be performed to the metal layer 23 and the barrier metal layer 21 to form the metal lines 20, which may be localized within the trenches 11, respectively. In some example embodiments, the planarization process may be performed until the top surface of the low-k dielectric 10 is exposed. Accordingly, the barrier metal pattern 22 and the metal pattern 24 may be formed in each of the trenches 11. In some example embodiments, the planarization process may be performed using a chemical mechanical polishing (CMP) process. After the planarization process, as described with reference to FIG. 3A, there may be dangling bonds or defects on the exposed top surface of the low-k dielectric 10, and a metal oxide layer may be fainted on the top surfaces of the metal lines 20.

Figure 8:
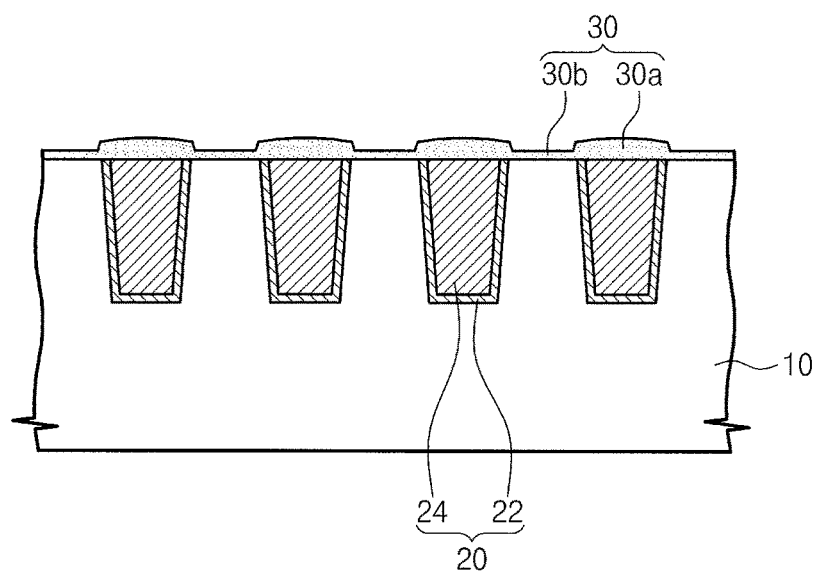

Referring to FIG. 8, the capping layer 30 may be formed to cover the top surfaces of the metal line 20 and the low-k dielectric 10. In some example embodiments, as described with reference to FIGS. 2 and 3A through 3D, the forming of the capping layer 30 may include repeating the pre-treatment process, the providing of the metal source gas, and the providing of the nitrogen source gas, for example, in a sequential manner.

As a result, the capping layer 30 may be formed of a different insulating material from the low-k dielectric 10, as described with reference to FIGS. 3A through 3D, and its chemical composition may vary depending on the underlying layer. For example, the capping layer 30 may be formed in such a way that a portion on the low-k dielectric 10 has a chemical composition different from that of other portion on the metal lines 20. In some example embodiments, the capping layer 30 may include the first portion 30a and the second portion 30b, which are provided on the metal lines 20 and the low-k dielectric 10, respectively, and have different chemical compositions from each other. In some example embodiments, the first portion 30a of the capping layer 30 may be formed to contain a metallic element and nitrogen, while the second portion 30b of the capping layer 30 may be formed to contain the metallic element, oxygen, and nitrogen. In other words, the first portion 30a of the capping layer 30 may be formed of a metal nitride layer, while the second portion 30b of the capping layer 30 may be formed of a metal oxide layer or a metal oxynitride layer. As a result of the difference in chemical composition between the first and second portions 30a and 30b, it may be possible to realize an etch selectivity between the first and second portions 30a and 30b. In other words, when the capping layer 30 is etched, the first and second portions 30b may be etched in etch rates different from each other. For example, the process of etching the capping layer 30 may be performed in such a way that a ratio in etch rate (i.e., etch selectivity) of the second portion 30b to the first portion 30a ranges from about 2:1 to about 5:1. This means that a selective etching on the capping layer 30 can be achieved without any additional mask.

In some example embodiments, the first portion 30a of the capping layer 30 may be formed of aluminum nitride, and the second portion 30b of the capping layer 30 may be formed of aluminum oxide. In this case, under a wet-etching process using diluted HF etching solution, the capping layer 30 may have an etch selectivity of about 2:1 to about 5:1.

In some example embodiments, the first portion 30a of the capping layer 30 may have a high etch selectivity with respect to the low-k dielectric 10, while the second portion 30b of the capping layer 30 may have a low etch selectivity with respect to the low-k dielectric 10. In other words, the second portion 30b of the capping layer 30 may be selectively etched, when the low-k dielectric 10 is etched.

Further, the first portion 30a of the capping layer 30 may be thicker than the second portion 30b of the capping layer 30. The thickness of the capping layer 30 may be selected to realize the etch selectivity between the first portion 30a and the second portion 30b. For example, the capping layer 30 may have a thickness of about 200 Å.

Figure 13:
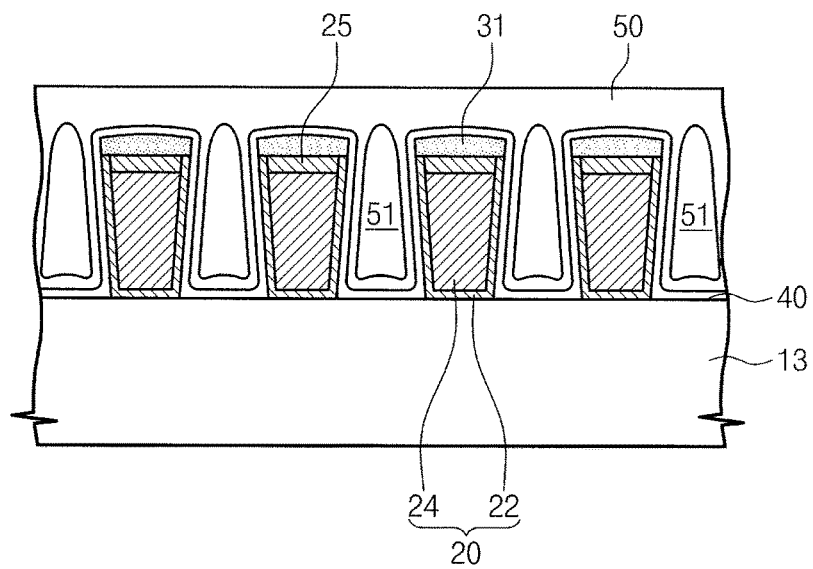

As shown in FIG. 13, before the formation of the capping layer 30, a metal capping layer 25 may be formed to cover the metal pattern 24 of the metal line 20 top surface. For example, before the formation of the capping layer 30, the top surface of the metal pattern 24 may be recessed to expose partially the sidewall of the barrier metal pattern 22. For example, an isotropic etching process may be performed using an etching recipe, which may be selected to have an etch selectivity with respect to the low-k dielectric 10 and the barrier metal pattern 22, to recess the top surface of the metal pattern 24. As a result of the isotropic etching process, metallic particles may be removed from the surface of the low-k dielectric 10.

Next, the metal capping layer 25 may be formed on the top surfaces of the recessed portion of the metal pattern 24. The metal capping layer 25 may be in contact with the top surface of the metal pattern 24 and a portion of the sidewall of the barrier metal pattern 22. The metal capping layer 25 may be formed of a conductive metal material, such as tungsten (W), tantalum (Ta), titanium (Ti), cobalt tungsten phosphide (CoWP), cobalt tin phosphide (CoSnP), cobalt phosphide (CoP), cobalt boride (CoB), cobalt tin boride (CoSnB), palladium (Pd), indium (In), nickel boride (NiB), tungsten nitride (WN), tantalum nitride (TaN), titanium nitride (TiN), tantalum oxide (TaO), and titanium oxide (TiO). The metal capping layer 25 may be formed using a deposition technique having an excellent step coverage property (for example, a chemical vapor deposition (CVD) or an atomic layer deposition (ALD)). In addition, the metal capping layer 25 may be formed to have a planarized or flat top surface, and the top surface of the low-k dielectric 10 may also be planarized during the planarization process on the metal capping layer 25. The capping layer 30 may be formed on the low-k dielectric 10 and the metal capping layer 25 that have the planarized top surfaces, as described with reference to FIG. 8, and the first portion 30a of the capping layer 30 may be formed to cover the top surface of the metal capping layer 25.

In the meantime, since the metal lines 20 in the trenches 11 are disposed adjacent to each other, when the metal lines 20 are applied with electrical signals, the metal lines 20 may suffer from a signal delay problem caused by parasitic capacitance. To reduce the parasitic capacitance between the metal lines 20, after the formation of the capping layer 30, air gaps 51 having a dielectric constant of about 1 may be formed between the metal lines 20. The formation of the air gap 51 will be described in more detail with reference to FIGS. 9 through 11.

Figure 9:
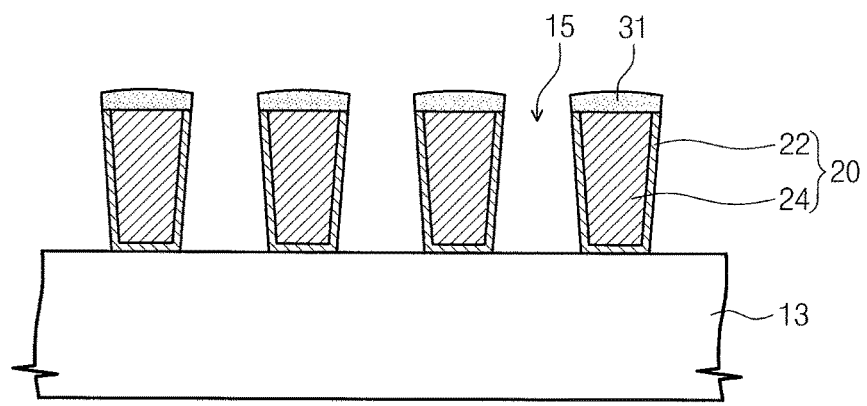

Referring to FIG. 9, portions of the low-k dielectric 10 between the metal lines 20 may be recessed to form recess regions 15 exposing the sidewalls of the metal lines 20. In some example embodiments, the formation of the recess region 15 may include performing a wet-etching process to the capping layer 30 to etch selectively the second portion 30b and thereby expose the low-k dielectric 10, and then, etching the low-k dielectric 10, for example, using a wet-etching process, to expose the sidewalls of the metal lines 20.

In the wet-etching process performed on/to the capping layer 30, the first portion 30a may have an etch selectivity with respect to the second portion 30b or exhibit an etch rate different from that of the second portion 30b. Accordingly, during the formation of the recess region 15, the second portion 30b of the capping layer 30 may be selectively etched to form capping patterns 31 remaining on the metal lines 20. Further, since the capping patterns 31 have a high etch selectivity for the wet-etching process performed to the low-k dielectric 10, the capping patterns 31 make it possible to protect/prevent the metal patterns 24 of the metal lines 20 from being exposed to etching solution for forming the recess region 15. Accordingly, it is possible to protect/prevent the metal patterns 24 from being unintentionally damaged or etched.

In some example embodiments, the wet-etching processes to the capping layer 30 and the low-k dielectric 10 may be performed in a successive manner using the same etch recipe. In some example embodiments, the first portion 30a of the capping layer 30 may be formed of aluminum nitride, and the second portion 30b of the capping layer 30 may be formed of aluminum oxide. In this case, the capping layer 30 and the low-k dielectric 10 may be wet-etched using diluted HF etching solution.

Figure 14:
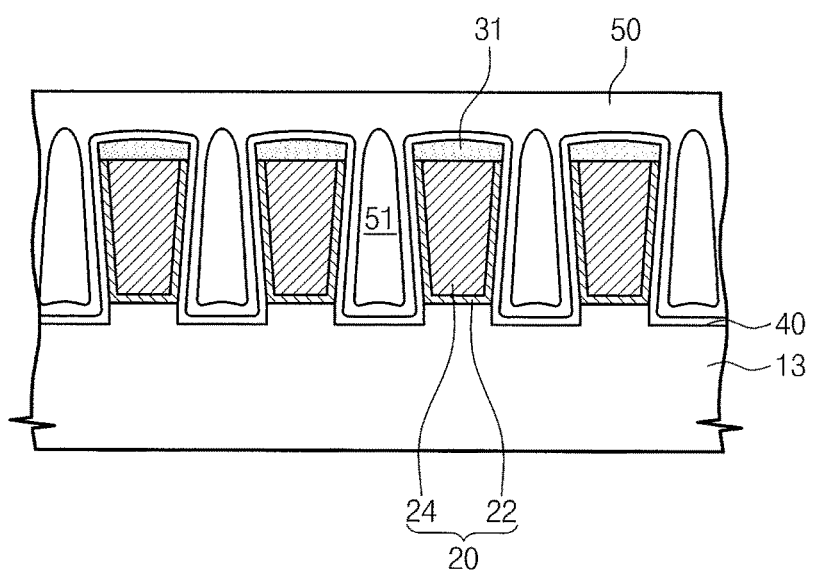

Meanwhile, the recess region 15 may be formed to expose wholly or partially the sidewalls of the metal lines 20. The top surface of the recessed portion of the low-k dielectric 13 may be located at a level that is lower than the bottom surfaces of the metal lines 20, as shown in FIG. 14. In some embodiments, the top surface of the recessed portion of the low-k dielectric 13 may be located at a level that is higher than the bottom surfaces of the metal lines 20.

Figure 10:
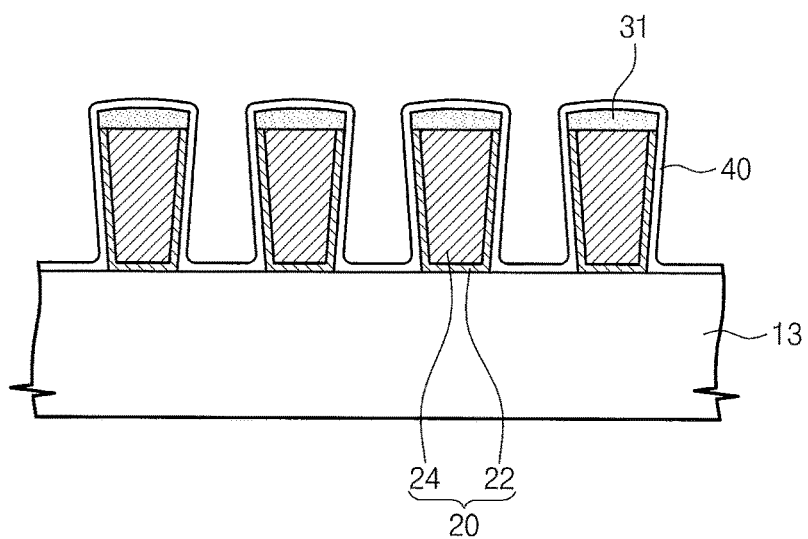

Referring to FIG. 10, a buffer insulating layer 40 may be formed to cover conformally the sidewalls of the metal lines 20 and the top surfaces of the capping patterns 31. The buffer insulating layer 40 may be formed of a low-k dielectric material (e.g., SiN, SiON, SiC, SiCN, SiOCH, SiOC, or SiOF). The buffer insulating layer 40 may contribute to protecting/preventing moisture or pollutants from being permeated into the metal lines 20. The buffer insulating layer 40 may be formed using a film-forming technique exhibiting a good step coverage property (for example, a chemical vapor deposition (CVD) or an atomic layer deposition (ALD)).

Figure 15:
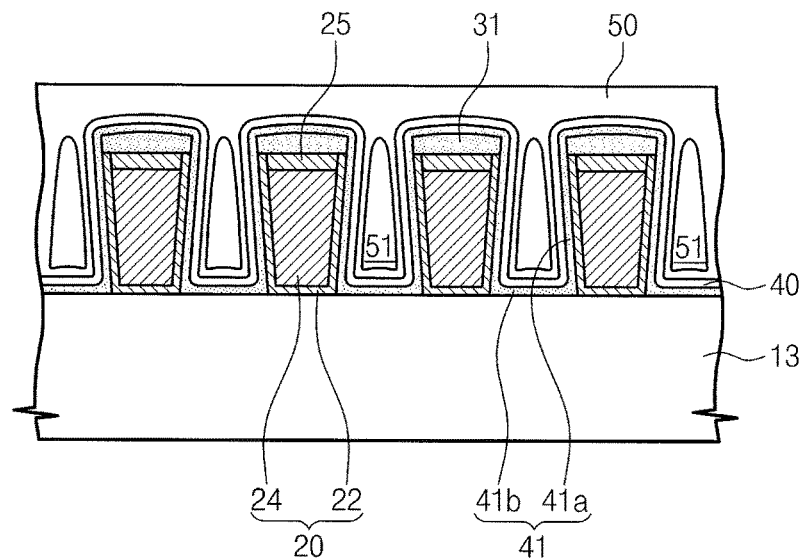

As shown in FIG. 15, before the formation of the buffer insulating layer 40, a capping insulating layer 41 may be further formed to cover conformally the sidewalls of the metal lines 20 and the top surfaces of the capping patterns 31. In example embodiments, the capping insulating layer 41 may be formed using the same method as that for the capping layer 30 described with reference to FIG. 8. For example, the capping insulating layer 41 may be formed by sequentially repeating the pre-treatment process, the providing of the metal source gas, and the providing of the nitrogen source gas. Accordingly, the capping insulating layer 41 may be formed to have portions, whose chemical compositions are different from each other, depending on the underlying layers thereof. For example, the capping insulating layer 41 may include first regions 41a, which may be provided on the sidewalls of the metal lines 20 and the top surfaces of the capping patterns 31 and include a metal nitride layer, and second regions 41b, which may be provided on the top surfaces of the recessed portions of the low-k dielectric 13 and include a metal oxide layer.

Figure 11:
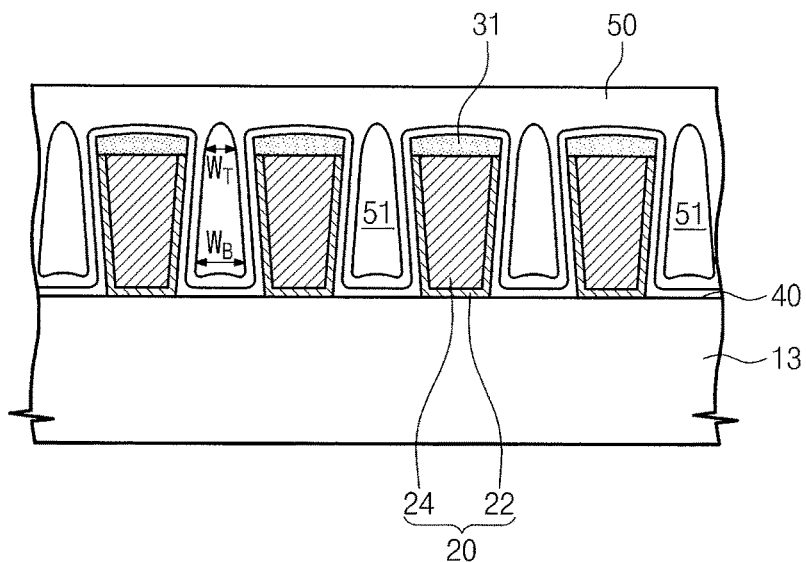

Referring to FIG. 11, an insulating layer 50 may be formed to define the air gap 51 between the metal lines 20. Here, the air gap 51 may be formed in the recess region 15 provided with the buffer insulating layer 40.

The insulating layer 50 may be formed to exhibit a poor step coverage property. For example, the insulating layer 50 may be formed using a deposition process exhibiting the poor step coverage property (for example, physical vapor deposition process). As a result, the insulating layer 50 may be thicker on the top surfaces of the metal lines 20 than on the sidewalls of the metal lines 20. In addition, an overhang may occur during the deposition of the insulating layer 50. That is, the insulating layer 50 may be formed not to fill completely gap regions between the metal lines 20, thereby defining the air gaps 51 between the metal lines 20. In example embodiment, the highest point of the air gap 51 may be positioned higher than the top surfaces of the metal lines 20 or, preferably, than the top surfaces of the capping patterns 31. Furthermore, the air gap 51 may be formed to have a top width $W_T$ smaller than a bottom width $W_B$, thereby having an inclined sidewall. In other words, the air gap 51 may be formed to have an upward tapered section. As described above, since the air gap 51 having a dielectric constant of 1 is formed between the metal lines 20, it is possible to reduce a capacitive coupling between the metal lines 20 and improve an RC-delay property of the semiconductor device.

Figure 12:
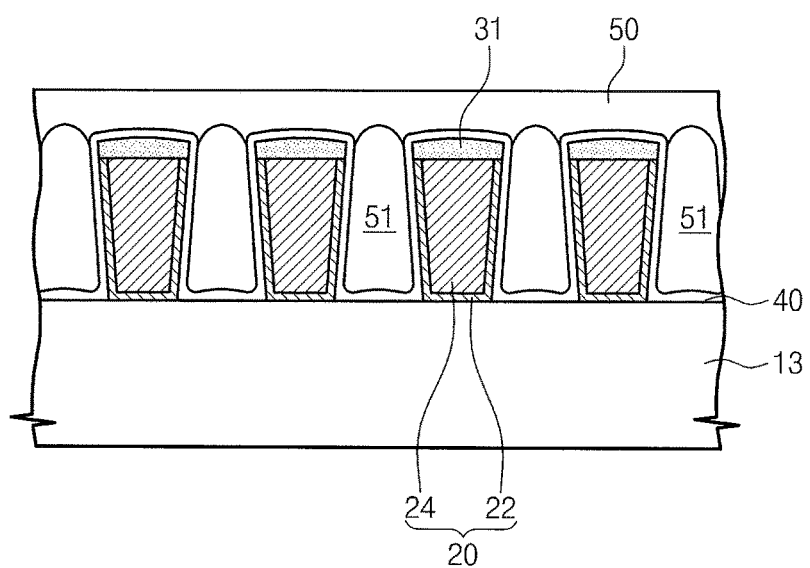
FIGS. 12 through 15 are sectional views illustrating methods of fabricating a semiconductor device, according to various example embodiments of the present inventive concepts.

During the formation of the insulating layer 50, the buffer insulating layer 40 may be exposed by the air gap 51, similar to the device of FIG. 12. Even in this case, the insulating layer 50 may be deposited on the bottom portion of the recess region 15.

the insulating layer 50 may be formed of at least one of, for example, high density plasma (HDP) oxide, tetraethylorthosilicate (TEOS), plasma-enhanced TEOS (PE-TEOS), $O_3$-TEOS, undoped silicate glass (USG), phosphosilicate glass (PSG), borosilicate glass (BSG), borophosphosilicate glass (BPSG), fluoride silicate glass (FSG), spin on glass (SOG), tonen silazene (TOSZ), or any combination thereof. Further, the insulating layer 50 may be formed of at least one of silicon nitride, silicon oxynitride, or low-k dielectric materials having a low dielectric constant.

FIGS. 16 through 21 are sectional views illustrating examples of a method of fabricating a semiconductor device, according to various example embodiments of the present inventive concepts. Process steps to be described in the present embodiments may be performed to the resulting structure provided with the capping layer 30 described with reference to FIGS. 5 through 8.

Figure 16:
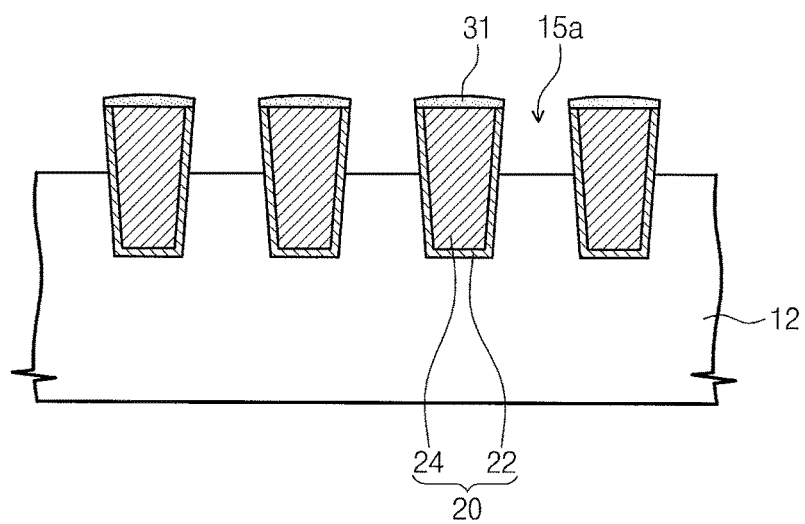
FIGS. 16 through 21 are sectional views illustrating a method of fabricating a semiconductor device, according to various example embodiments of the present inventive concepts.

Referring to FIG. 16, portions of the low-k dielectric 10 between the metal lines 20 may be recessed to form first recess region 15a exposing upper sidewalls of the metal lines 20. When the first recess region 15a is formed, the capping layer 30 may be selectively etched to form the capping patterns 31. As a result of the etch selectivity between the first and second portions (e.g., 30a and 30b of FIG. 8), the capping patterns 31 may be formed on the metal lines 20, respectively. According to some embodiments, the depth of the first recess region 15a may be changed depending on a difference in etch rate between the low-k dielectric 10 and the capping pattern 31.

As described with reference to FIG. 9, the first recess region 15a may be formed by performing a wet-etching process to the low-k dielectric 10. The process for etching the low-k dielectric 10 may be performed using the same etch recipe as that for the wet-etching process performed to the capping layer 30. In some example embodiments, the process of etching the capping layer 30 and the low-k dielectric 10 may be performed in a wet-etching manner using diluted HF etching solution.

Figure 17:
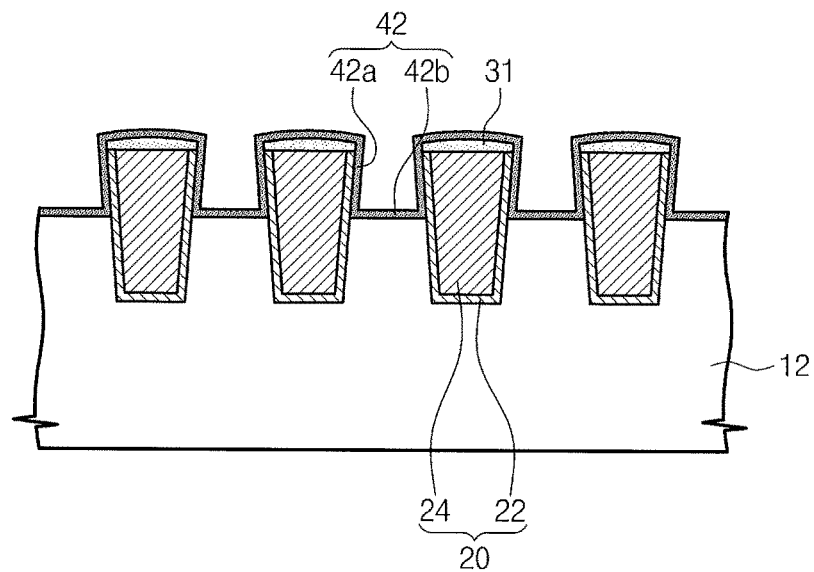

Referring to FIG. 17, a first protection layer 42 may be formed to cover conformally the inner wall of the first recess region 15a. The first protection layer 42 may be formed using the method for forming the capping layer that was previously described with reference to FIGS. 2 and 3A through 3D. For example, the formation of the first protection layer 42 may include sequentially repeating the pre-treatment process, the providing of the metal source gas, and the providing of the nitrogen source gas. In other words, the first protection layer 42 may include a first portion 42a covering the surfaces of the metal lines 20 and the capping pattern 31 and a second portion 42b covering the top surface of a partially recessed low-k dielectric 12. Here, the first portion 42a and the second portion 42b may have an etch selectivity with respect to each other. In some example embodiments, the first portion 42a of the first protection layer 42 may be formed of a metal nitride layer, and the second portion 42b of the first protection layer 42 may be formed of a metal oxide layer or a metal oxynitride layer.

Figure 18:
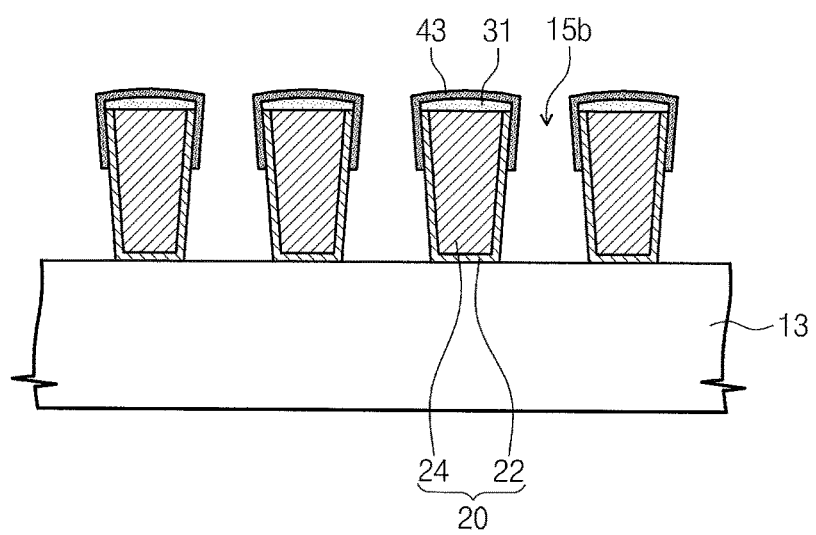

Referring to FIG. 18, a wet-etching process may be performed on/to the first protection layer 42 and the partially recessed low-k dielectric 12 to form the second recess regions 15b exposing lower sidewalls of the metal lines 20. The formation of the second recess regions 15b may include performing a wet-etching process to the first protection layer 42 to expose the partially recessed low-k dielectric 12, and then, performing a wet-etching process to portions of the partially recessed low-k dielectric 12 to expose the lower sidewalls of the metal lines 20. In some example embodiments, the formation of the second recess region 15b may be performed using diluted HF etching solution.

When the second recess region 15b is formed, the first portion 42a of the first protection layer 42 may have the etch selectivity with respect to the recessed low-k dielectric 13, and thus, the first portion 42a of the first protection layer 42 may remain even after the second portion 42b of the first protection layer 42 is removed. Accordingly, a first protection pattern 43 may be formed to cover the top surface of the capping pattern 31 and the upper sidewalls of the metal lines 20. The first protection pattern 43 may be formed of the same material (e.g., metal nitride) as that of the capping pattern 31.

Figure 19:
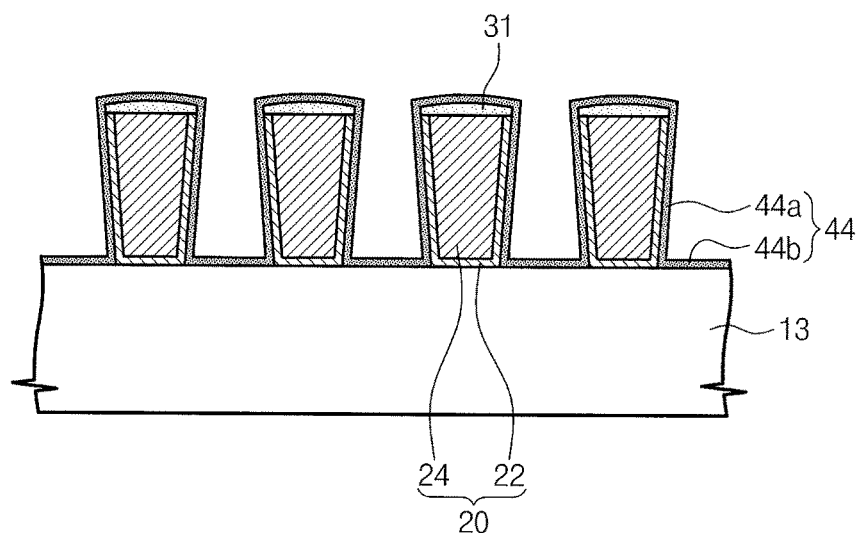

Referring to FIG. 19, a second protection layer 44 may be formed to cover conformally the second recess region 15b. As described with reference to FIGS. 3A through 3D, the second protection layer 44 may be formed by sequentially repeating the pre-treatment process, the providing of the metal source gas, and the providing of the nitrogen source gas. Accordingly, the second protection layer 44 may be formed in such a way that portions on the lower sidewalls of the metal lines 20 have different chemical composition from that of other portions on the recessed low-k dielectric 13. The second protection layer 44 may include a first portion 44a in contact with the first protection pattern 43 and the metal line 20 and a second portion 44b in contact with the recessed low-k dielectric 13. In example embodiments, the first portion 44a of the second protection layer 44 may be formed of a metal nitride layer, while the second portion 44b may be formed of a metal oxide layer or a metal oxynitride layer.

Figure 20:
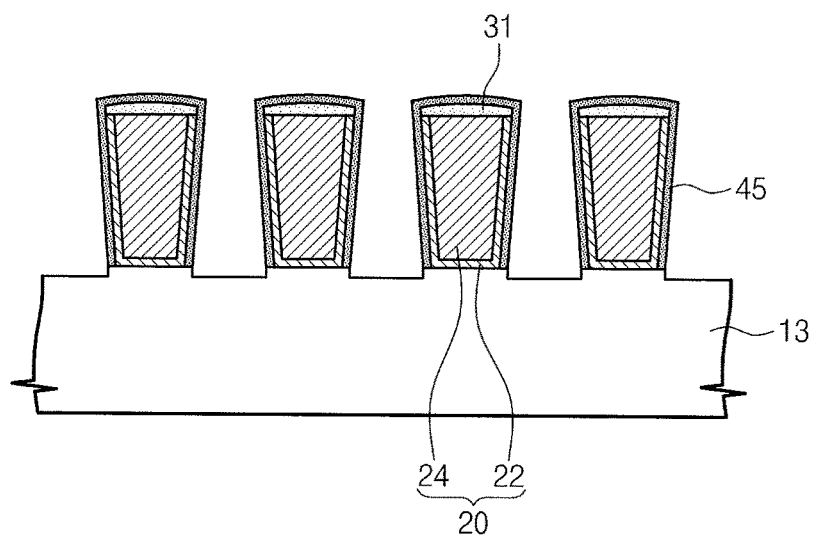

Referring to FIG. 20, the second portion 44b of the second protection layer 44 may be removed from the top surface of the recessed low-k dielectric 13 to form protection patterns 45. Each of the protection patterns 45 may extend from the top surface of the capping pattern 31 and cover the sidewall of the metal line 20. In some example embodiments, the protection patterns 45 may be formed of the same material as the capping pattern 31.

Figure 21:
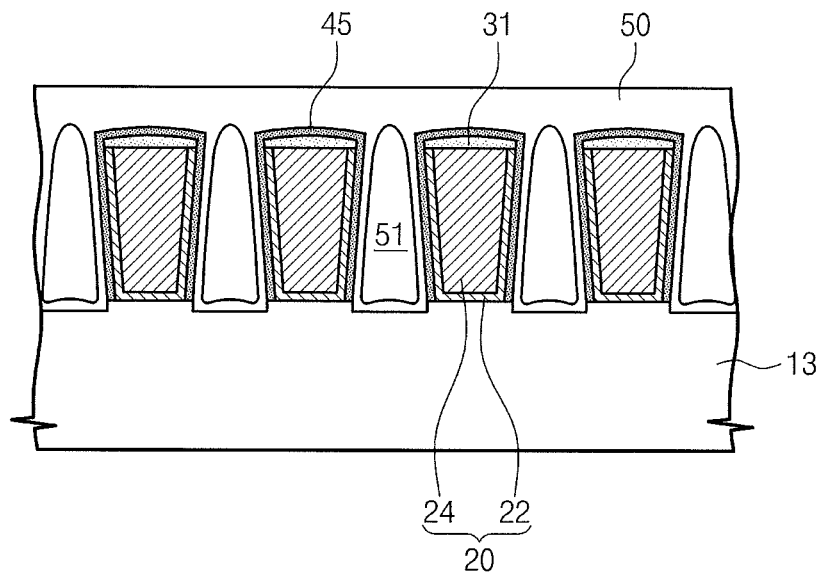

Referring to FIG. 21, the insulating layer 50 may be formed to define the air gaps 51 between the metal lines 20. The insulating layer 50 may be formed using a deposition process exhibiting a poor step coverage property, as described with reference to FIG. 11. Accordingly, a deposition thickness of the insulating layer 50 may be greater on the top surfaces of the metal lines 20 than on the sidewalls of the metal lines 20, and due to the consequent overhang, the air gaps 51 may be formed between the metal lines 20. According to some embodiments, the insulating layer 50 defining the air gap 51 may be in direct contact with the protection pattern 45 covering the sidewalls of the metal lines 20. Alternatively, the buffer insulating layer 40 made of a low-k dielectric material may be formed before the formation of the insulating layer 50, as described with reference to FIG. 10.

Figure 22:
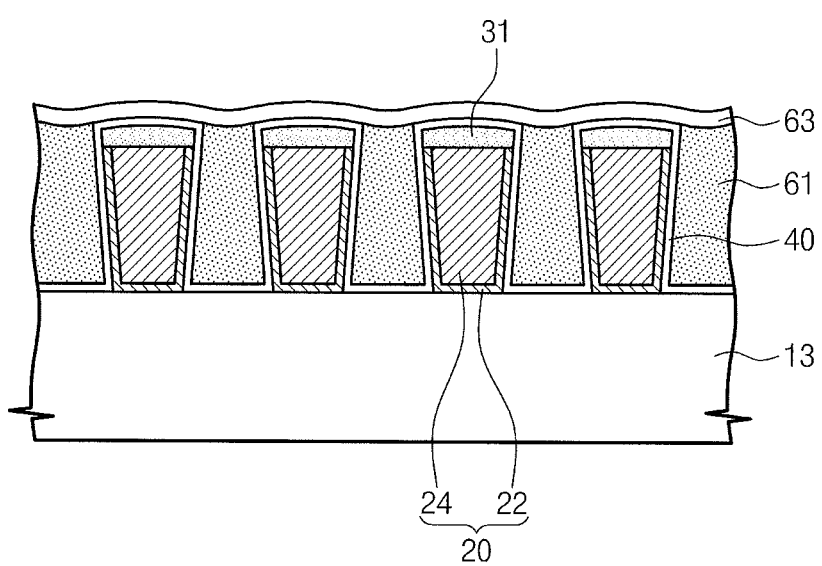
FIGS. 22 through 25 are sectional views illustrating a method of fabricating a semiconductor device, according to various example embodiments of the present inventive concepts.

FIGS. 22 through 25 are sectional views illustrating examples of a method of fabricating a semiconductor device, according to some example embodiments of the present inventive concepts. According to some embodiments, as described with reference to FIGS. 5 through 9, the recess region 15 may be formed to expose the sidewalls of the metal lines 20, and then, the air gaps may be formed using a porous insulating layer. For example, as shown in FIG. 22, a sacrificial layer 61 may be formed to fill a gap between the metal lines 20. The sacrificial layer 61 may be formed of a material having an etch selectivity with respect to the buffer insulating layer 40. In example embodiments, the sacrificial layer 61 may be formed of a material whose main constituent is carbon. For example, the sacrificial layer 61 may be formed of a layer made of carbon and hydrogen or a layer made of carbon, hydrogen, and oxygen. In example embodiments, the sacrificial layer 61 may be formed of a spin-on-hardmask (SOH) layer or an amorphous carbon layer (ACL). The SOH layer may include a carbon-based SOH layer or a silicon-based SOH layer. In some embodiments, the sacrificial layer 61 may be formed of a photoresist layer or an amorphous silicon layer. The sacrificial layer 61 may be formed using a spin-coating method, and then, an etch-back process may be performed to expose portions of the buffer insulating layer 40 on the metal lines 20.

Next, a porous insulating layer 63 may be formed to cover the sacrificial layer 61. The porous insulating layer 63 may also cover the buffer insulating layer 40 on the metal lines 20. In some example embodiments, the porous insulating layer 63 may be an insulating layer with a plurality of pores. For example, the porous insulating layer 63 may be a porous low-k material. For example, the porous insulating layer 63 may be formed by, for example, forming a carbon-doped silicon oxide layer and performing a thermal treatment thereto. As a result of thermal treatment, carbon atoms in a silicon oxide layer may be combined with silicon atoms to form a cage-like structure having a lower density than $SiO_2$. A SiCOH layer may be an example of the silicon oxide layer having the cage-like structure. The SiCOH layer may be formed using trimethylsilane (3MS, $(CH_3)_3$—Si—H), tetramethylsilane (4MS, $(CH_3)_4$—Si), vinyltrimethylsilane (VTMS, $CH_2$=CH—Si $(CH_3)_3$) as a precursor. An oxygen-containing oxidant gas (e.g., hydrogen peroxide) may be used for oxidizing the precursor. The carbon-doped silicon oxide layer may be formed using a PECVD or ALD process. The carbon-doped silicon oxide layer may be converted into the porous insulating layer 63 (e.g., p-SiCOH) by thermal treatment process. In some embodiments, the porous insulating layer 63 may be formed by forming a porous silicon layer and thermally treating the porous silicon layer. The porous insulating layer 63 may be formed in such a way that pores therein have a size or a diameter ranging from several ten nanometers to several hundred nanometers.

Figure 23:
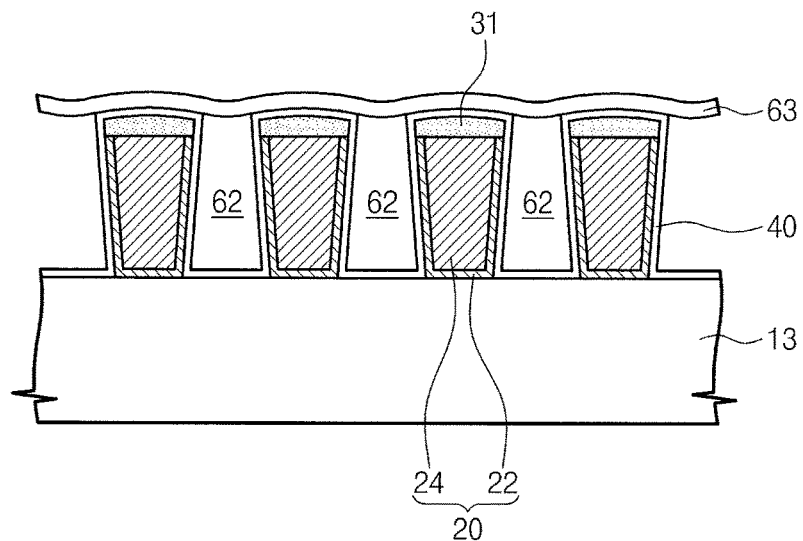

Referring to FIG. 23, the sacrificial layer 61 may be removed through the pores of the porous insulating layer 63. In the case where the sacrificial layer 61 is formed of a SOH layer or a photoresist layer, the sacrificial layer 61 may be removed by an aching process using oxygen, ozone, or ultraviolet light or a wet cleaning process. For example, in the case where the sacrificial layer 61 is formed of the SOH layer or the photoresist layer, the removal of the sacrificial layer 61 may be performed using a mixture of fluorine-based etching gas and O-$_2$ or a mixture of fluorine-based etching gas, O$_2$, and Ar. Here, the fluorine-based etching gas may be one of C$_3$F$_6$, C$_4$F$_6$, C$_4$F$_8$, or C$_5$F$_8$. In the case where the sacrificial layer 61 is formed of the amorphous silicon layer, the removal of the sacrificial layer 61 may be performed by an isotropic etching process using a chlorine-containing gas.

Figure 25:
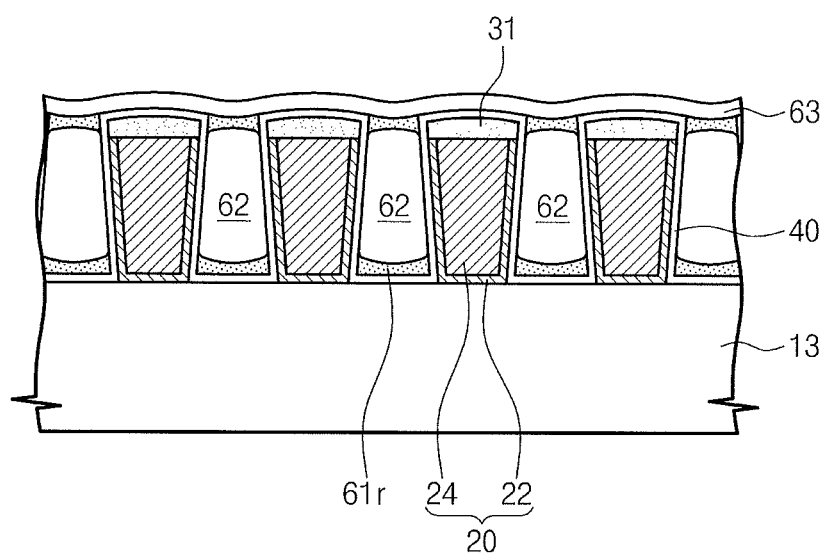

As a result of the removal of the sacrificial layer 61, air gaps 62 may be formed between the metal lines 20 below the porous insulating layer 63. The buffer insulating layer 40 and the porous insulating layer 63 may delimit the air gaps 62 between the metal lines 20. In other words, the buffer insulating layer 40 covering the sidewalls of the metal lines 20 may be exposed by the air gap 62. In some embodiments, when the sacrificial layer 61 is removed through the pores of the porous insulating layer 63, the whole portion of the sacrificial layer 61 may not be removed to remain a portion 61r of the sacrificial layer 61 in the recess region, as shown in FIG. 25. In the case where the air gaps 62 are formed using the porous insulating layer 63 as described above, it is possible to increase a volume of each of the air gaps 62.

Figure 24:
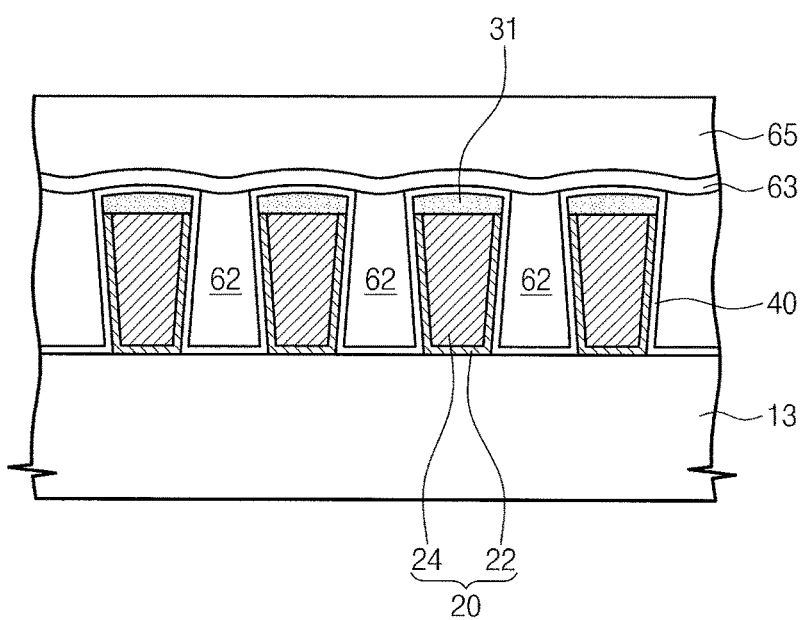

Referring to FIG. 24, after the formation of the air gap 62, a densification process may be performed on the porous insulating layer 63. As a result of the densification process, the number and the size of the pores may be decreased, and thus, the porous insulating layer 63 may have an increased density. In example embodiments, the densification process may be performed using a rapid thermal treatment process. For example, during the rapid thermal treatment process, the porous insulating layer 63 may be heated to a temperature of about 800° C. to 1000° C. in an atmosphere of N$_2$O, NO, N$_2$, H$_2$O or O$_2$. After the densification process on the porous insulating layer 63, at least one interlayered insulating layer 65 may be deposited on the porous insulating layer 63.

Figure 26:
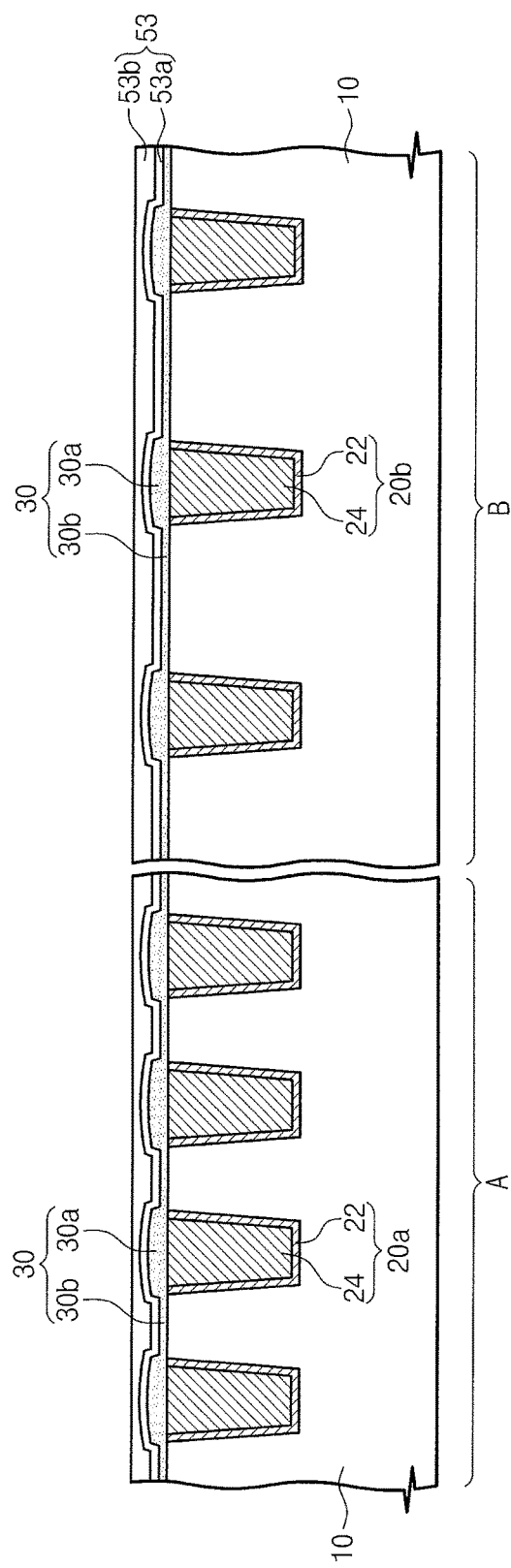
FIGS. 26 through 31 are sectional views illustrating a method of fabricating a semiconductor device, according to various example embodiments of the present inventive concepts.

FIGS. 26 through 31 are sectional views illustrating examples of a method of fabricating a semiconductor device, according to some example embodiments of the present inventive concepts. Referring to FIG. 26, the low-k dielectric 10 may include a first region A, on which first metal lines 20a with high integration density will be disposed, and a second region B, on which second metal lines 20b with low integration density will be disposed. For example, the first metal lines 20a may be disposed on the first region A of the low-k dielectric 10 to have a first space, while the second metal lines 20b may be disposed on the second region B to have a second space larger than the first space. As described with reference to FIGS. 5 through 8, the formation of the first and second metal lines 20a and 20b on the first and second regions A and B may include forming the trenches 11 in the low-k dielectric 10 and forming the barrier metal pattern 22 and the metal pattern 24 in each of the trenches 11. In some embodiments, the space between the first metal lines 20a on the first region A may be substantially the same as that between the second metal lines 20b on the second region B.

Referring to FIG. 26, the capping layer 30 may be formed on the first and second regions A and B to cover top surfaces of the first and second metal lines 20a and 20b and the low-k dielectric 10. The capping layer 30 may be formed by sequentially repeating the pre-treatment process, the providing of the metal source gas, and the providing of the nitrogen source gas, as described with reference to FIGS. 2 and 3A through 3D.

The capping layer 30 may include the first portion 30a on the first and second metal lines 20a and 20b and the second portion 30b on the low-k dielectric 10, and the first portion 30a and the second portion 30b may have different chemical compositions from each other. In some example embodiments, the first portion 30a of the capping layer 30 may be formed of a metal nitride layer, while the second portion 30b of the capping layer 30 may be formed of a metal oxide layer or a metal oxynitride layer. Accordingly, when the capping layer 30 is wet-etched, the first and second portions 30b may be etched in etch rates different from each other. For example, the process of etching the capping layer 30 may be performed in such a way that a ratio in etch rate (i.e., etch selectivity) of the second portion 30b to the first portion 30a ranges from about 2:1 to about 5:1. This means that a selective wet-etching on the capping layer 30 can be achieved without any additional mask.

Furthermore, the first portions 30a of the capping layer 30 may be formed to have an etch selectivity with respect to an etch recipe to be used for etching the low-k dielectric 10. Accordingly, when the low-k dielectric 10 is etched, the first portion 30a of the capping layer 30 may protect/prevent the top surfaces of the metal lines 20 from being exposed.

Further, the first portion 30a of the capping layer 30 may be thicker than the second portion 30b of the capping layer 30. The thickness of the capping layer 30 may be selected to realize the etch selectivity between the first portion 30a and the second portion 30b.

In some example embodiments, after the formation of the capping layer 30, a diffusion-barrier layer 53 may be formed on the capping layer 30. The diffusion-barrier layer 53 may be formed of silicon nitride (SiN), silicon oxynitride (SiON), silicon carbide (SiC), silicon carbon nitride (SiCN), or any combination thereof.

In some example embodiments, the diffusion-barrier layer 53 may include first and second diffusion-barrier layers 53a and 53b, which may be sequentially stacked and have an etch selectivity with respect to each other. For example, the first diffusion-barrier layer 53a may be formed of a silicon carbon nitride layer (SiCN), while the second diffusion-barrier layer 53b may be formed of a silicon oxynitride layer (SiON).

Figure 27:
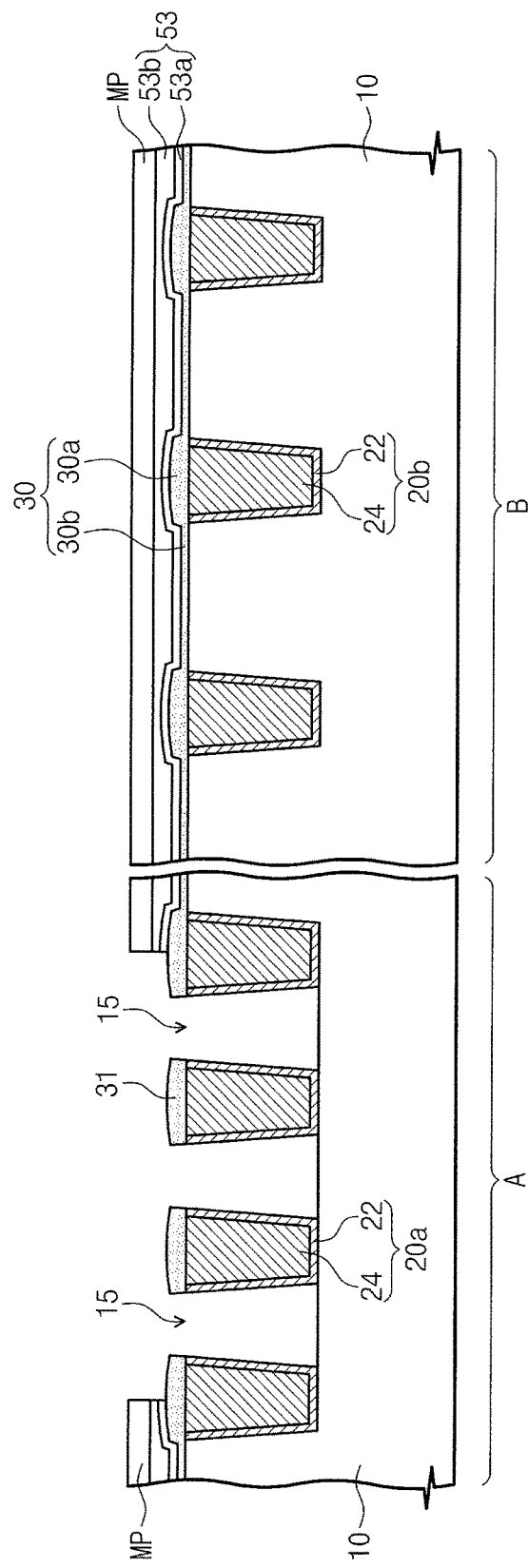

Referring to FIG. 27, a portion of the low-k dielectric 10 on the first region A may be recessed to form the recess region 15 between the first metal lines 20a on the first region A. According to some embodiments, the formation of the recess region 15 may include forming a mask pattern MP on the low-k dielectric 10 to expose a portion of the first region A of the capping layer 30, selectively wet-etching the second portion 30b of the capping layer 30 on the first region A using the mask pattern MP as an etch mask, and wet-etching the low-k dielectric 10 exposed by the mask pattern MP to expose the sidewalls of the metal lines 20. Here, the mask pattern MP may be formed to cover wholly the capping layer 30 on the second region B and expose the first and second portions 30a and 30b of the capping layer 30 on the first region A.

In some example embodiments, when the capping layer 30 exposed by the mask pattern MP is wet-etched, the first portion 30a of the capping layer 30 may have the etch selectivity with respect to the second portion 30b. Accordingly, the first portion 30a of the capping layer 30 may remain on the top surfaces of the first metal lines 20a, while the second portion 30b of the capping layer 30 may be removed to expose the top surface of the low-k dielectric 10. In other words, the capping layer 30 exposed by the mask pattern MP may be selectively etched to form the capping patterns 31 on the top surfaces of the first metal lines 20a. Further, since the capping layer 30 on the second region B may be covered with the mask pattern MP, the second portion 30b of the capping layer 30 may remain on the second region B of the low-k dielectric 10. For example, a metal oxide layer may remain on the second region B of the low-k dielectric 10.

Furthermore, when the low-k dielectric 10 is wet-etched using the mask pattern MP as an etch mask, the capping pattern 31 may have a high etch selectivity with respect to the low-k dielectric 10. Accordingly, the metal pattern 24 may not be exposed to etching solution, and the sidewalls of the metal lines 20 may be exposed by the recess region 15. Further, in certain embodiments, the capping layer 30 and the low-k dielectric 10 may be successively wet-etched using the same etch recipe. The mask pattern MP may be removed after the formation of the recess region 15 on the first region A of the low-k dielectric 10.

In some example embodiments, the forming of the recess region 15 may include forming a protection layer, to which a selective wet-etching process can be realized, and performing an isotropic etching process at least two times to the protection layer and the low-k dielectric, as described with reference to FIGS. 16 through 21.

Figure 28:
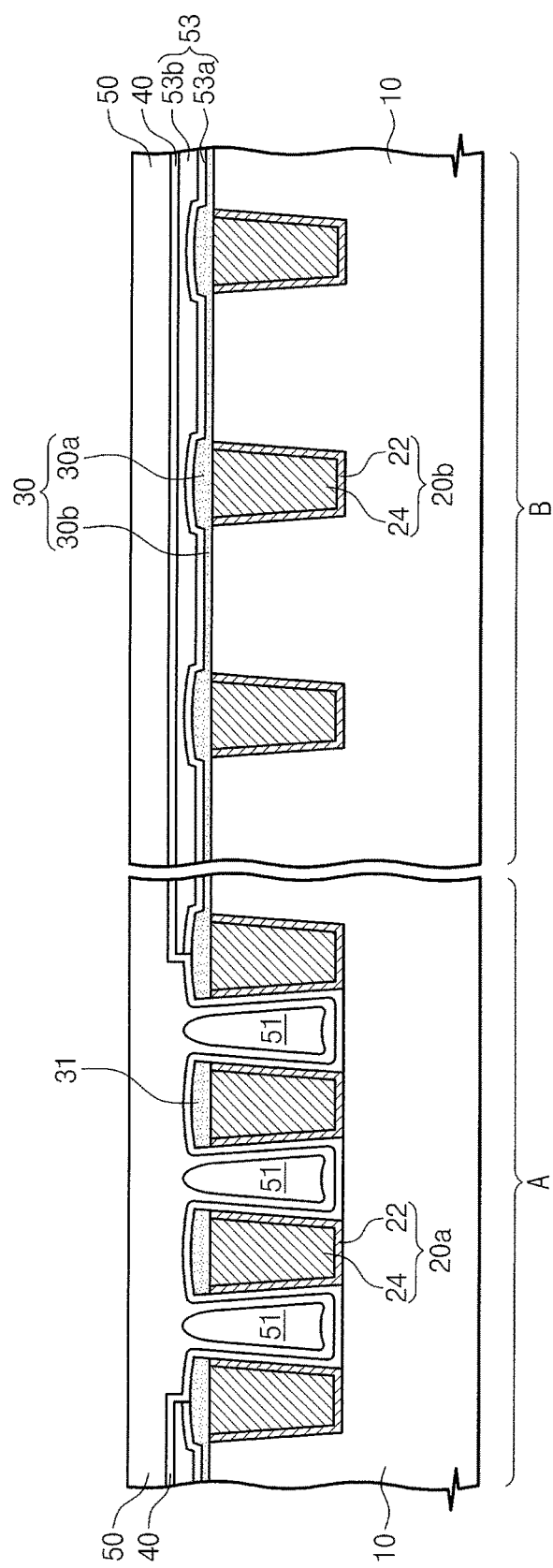

Referring to FIG. 28, the buffer insulating layer 40 may be formed to cover conformally the sidewalls of the first metal lines 20a exposed by the recess region 15. The buffer insulating layer 40 may be formed by conformally depositing a low-k dielectric material, as described with reference to FIG. 10.

Next, the insulating layer 50 may be formed to define the air gap 51 between the first metal lines 20a. As described with reference to FIG. 11, the insulating layer 50 may be formed using a deposition process exhibiting a poor step coverage property. Accordingly, a deposition thickness of the insulating layer 50 may be greater on the top surfaces of the first metal lines 20a than on the sidewalls of the first metal lines 20a, and due to the consequent overhang, the air gaps 51 may be formed between the first metal lines 20a.

Figure 29:
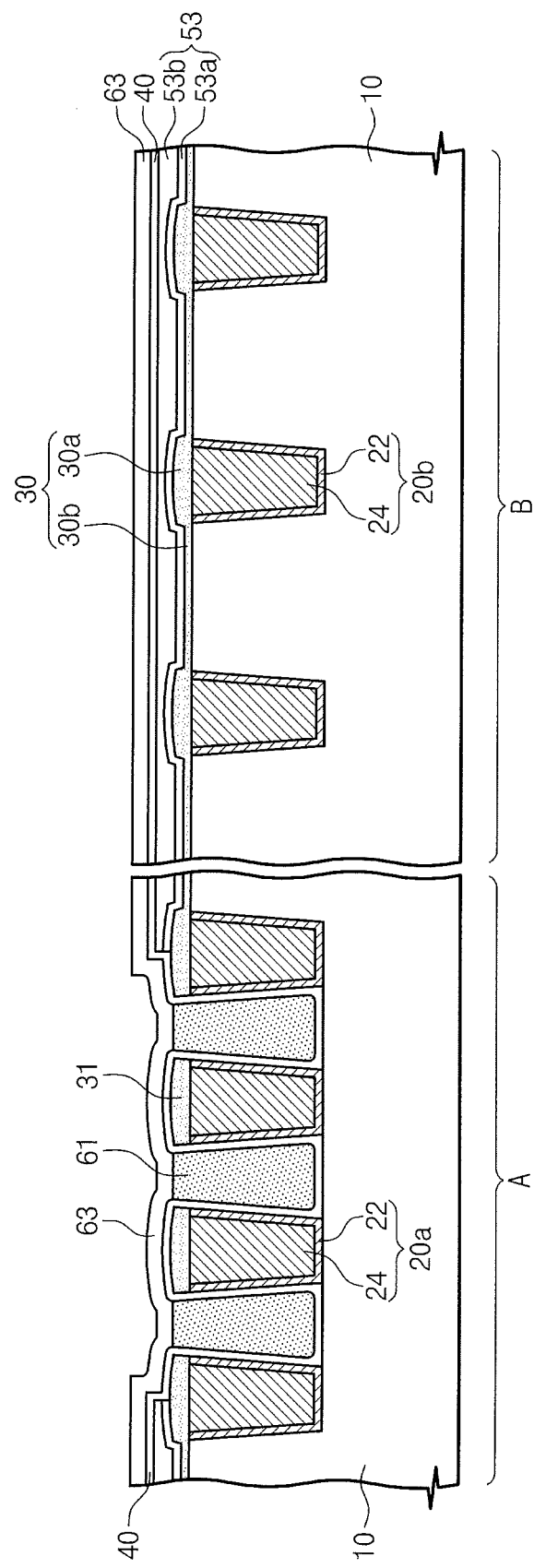

In some embodiments, after the buffer insulating layer 40 is formed to cover conformally the recess region 15, the sacrificial layer 61 may be formed to fill the recess region 15 provided with the buffer insulating layer 40, as shown in FIG. 29. The sacrificial layer 61 may be formed of a material having an etch selectivity with respect to the capping pattern 31 and the first metal lines 20a, as described with reference to FIG. 22. For example, the sacrificial layer 61 may be formed of a spin-on-hardmask (SOH) layer or an amorphous carbon layer (ACL). The SOH layer may include a carbon-based SOH layer or a silicon-based SOH layer. In some embodiments, the sacrificial layer 61 may be formed of a photoresist layer or an amorphous silicon layer.

The formation of the sacrificial layer 61 may include forming a sacrificial layer on the first and second regions A and B using a spin-coating method, and anisotropically etching the sacrificial layer to remove partially the sacrificial layer 61 from the second region B. The sacrificial layer 61 may be formed to fill the recess regions 15 and expose the top surfaces of the capping patterns 31.

Next, the porous insulating layer 63 may be formed to cover the sacrificial layer 61. The porous insulating layer 63 may extend from the first region A to the second region B, and the diffusion-barrier layer 53 may be interposed between the porous insulating layer 63 of the second region B and the capping layer 30. The porous insulating layer 63 may be an insulating layer with a plurality of pores. In some example embodiments, the porous insulating layer 63 may be a porous low-k dielectric. For example, the porous insulating layer 63 may be formed by forming a carbon-doped silicon oxide layer and performing a thermal treatment thereto.

Figure 30:
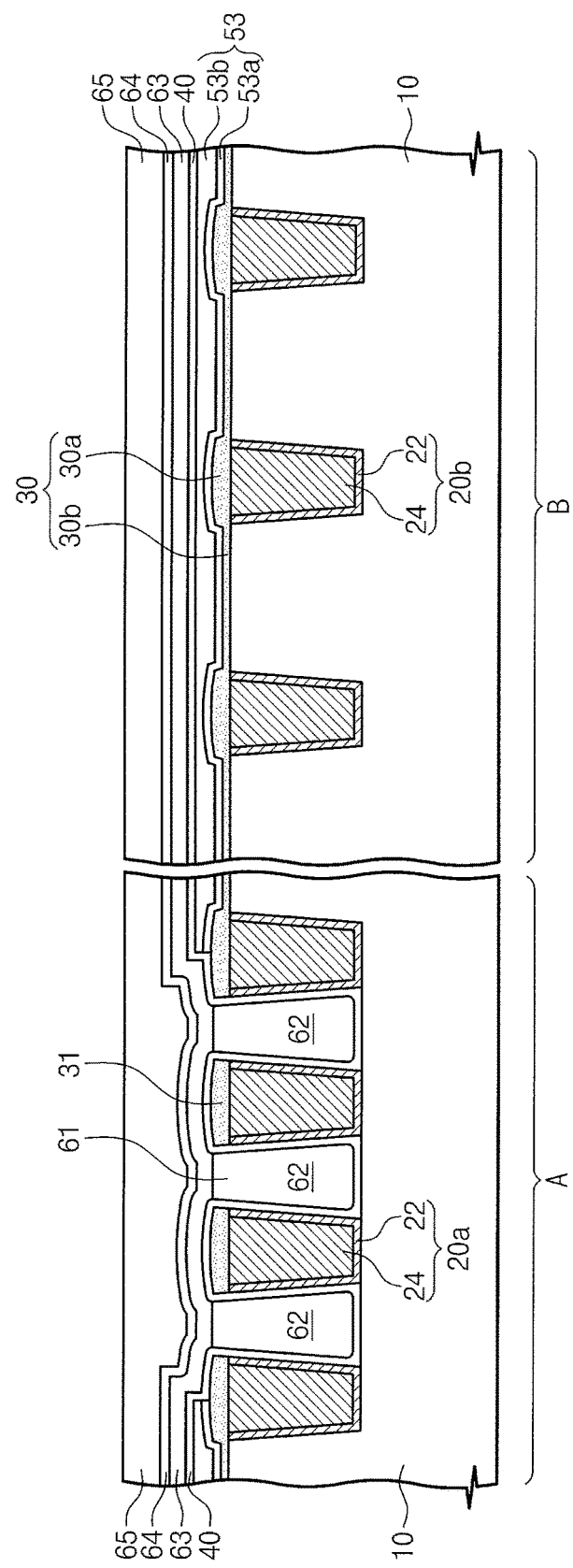

Referring to FIG. 30, the sacrificial layer 61 may be removed through the pores of the porous insulating layer 63, thereby forming the air gaps 62 on the first region A. The air gaps 62 may be formed to expose the buffer insulating layer 40 in the recess regions 15. After the formation of the air gaps 62, the diffusion-barrier layer 64 and the insulating layer 65 may be sequentially formed on the porous insulating layer 63. The diffusion-barrier layer 64 may be formed of silicon nitride (SiN), silicon oxynitride (SiON), silicon carbide (SiC), silicon carbon nitride (SiCN), or any combination thereof.

Figure 31:
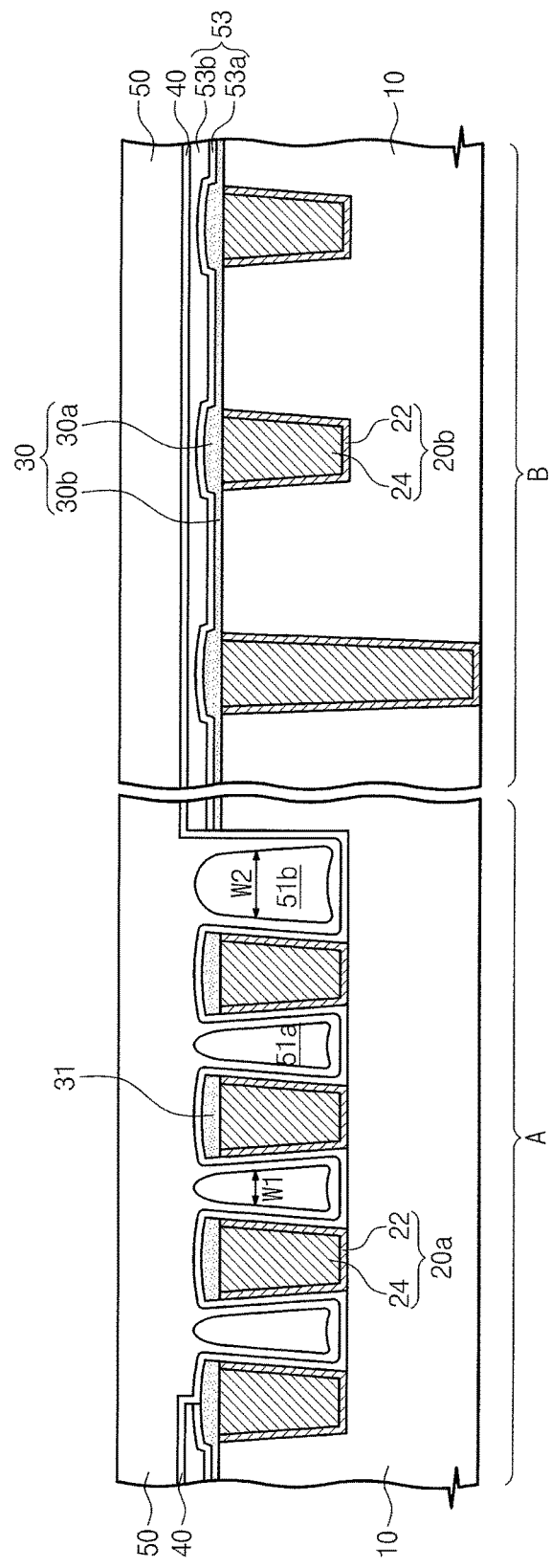

According to the device shown in FIG. 31, the low-k dielectric 10 may be formed the first region A to be provided with the first metal lines 20a and the second region B to be provided with the second metal lines 20b. A space between the first metal lines 20a may differ from that between the second metal lines 20b. For example, the first metal lines 20a may be disposed to have a first space on the first region A, while the second metal lines 20b may be disposed to have a second space on the second region B. In addition, a space between the first metal line 20a and the second metal line 20b disposed adjacent to each other may be greater than the first space. In some example embodiments, at least one of the second metal lines 20b may be formed to include a via plug penetrating the low-k dielectric 10.

According to some embodiments, the first air gap 51a may be formed between the first metal lines 20a, while the second air gap 51b may be formed between the first metal line 20a and the second metal line 20b disposed adjacent to each other. Here, the second air gap 51b may have a width W2 that is greater than a width W1 of the first air gap 51a.

FIGS. 32 through 36 are sectional views illustrating examples of semiconductor devices in which multi-layered interconnection structures formed by the fabrication methods according to various example embodiments of the present inventive concepts are provided. Referring to FIGS. 32 through 36, the semiconductor device may include vertically-stacked metal lines. For example, as shown in FIGS. 32 through 36, the lower metal lines 20L may be disposed spaced apart from each other on the low-k dielectric 10. The lower insulating layer 50L may be disposed on the lower metal lines 20L, and the lower air gap 51L may be formed between the lower metal lines 20L. The lower air gap 51L may be defined by the lower insulating layer 50L covering the lower metal lines 20L. Alternatively, the lower air gap 51L may be defined by a porous insulating layer.

According to some example embodiments of the present inventive concepts, the capping patterns 31 may be provided on the top surfaces of the lower metal lines 20L. The capping patterns 31 may be formed of an insulating material having an etch selectivity with respect to the low-k dielectric 10. As described with reference to FIGS. 5 through 11, the formation of the capping pattern 31 may include forming a capping layer including first and second portions, whose chemical compositions are different from each other, and then, removing the second portion.

The upper metal lines 20U may be disposed spaced apart from each other on the lower insulating layer 50L, and at least one of the upper metal lines 20U may penetrate the capping pattern 31 covering the top surface of the lower metal line 20L to be connected to the lower metal line 20L. At least one of the upper metal lines 20U may include a barrier metal pattern 22, a via plug 24a and an interconnection 24b. For example, the via plug 24a of the upper metal line 20U may penetrate the capping pattern 31 covering the top surface of the lower metal line 20L to be connected to the lower metal line 20L.

Figure 36:
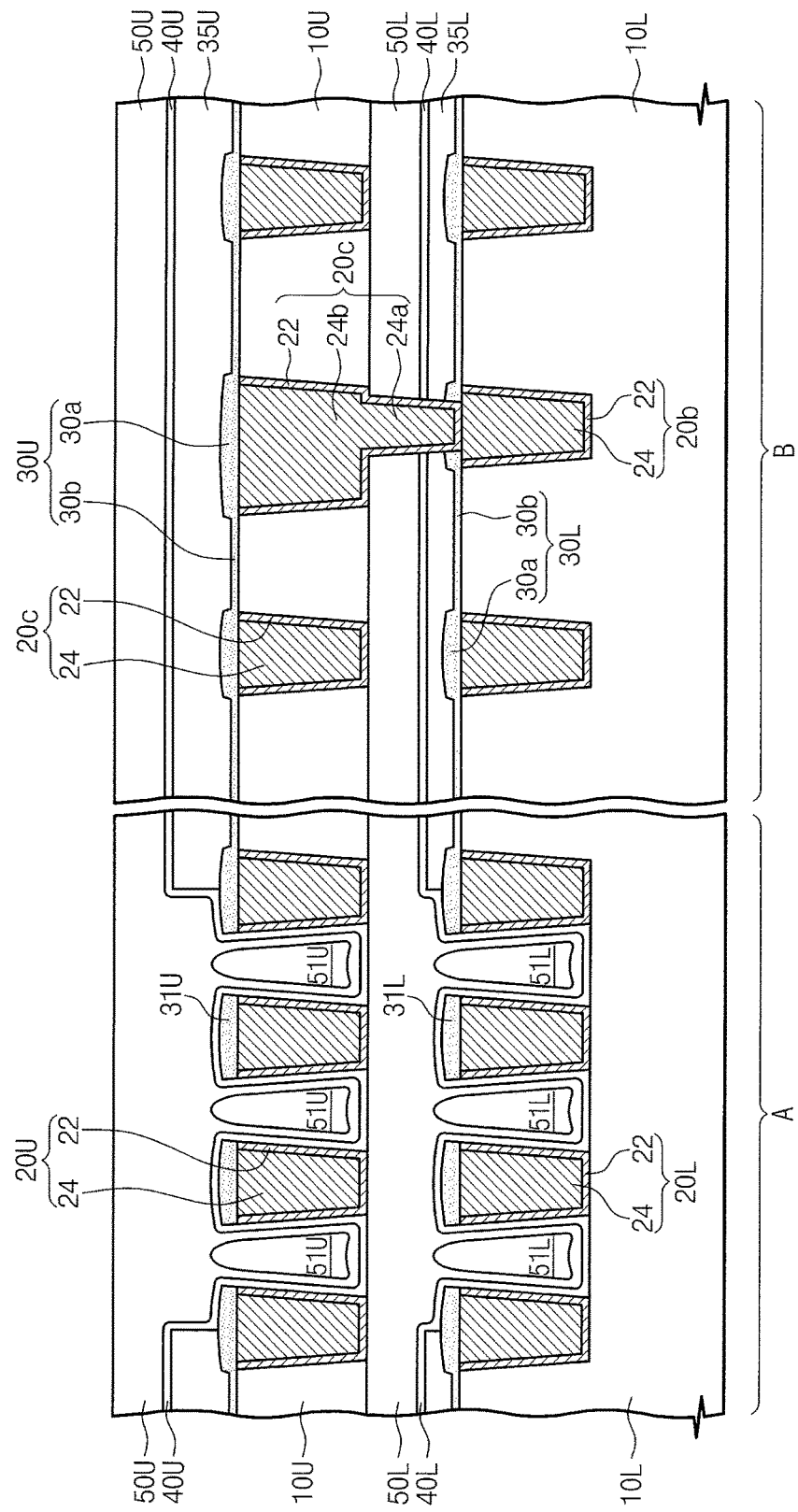

Further, as shown in FIG. 36, the lower metal lines 20L may be disposed on a lower layer 1 provided with a conductive pattern 2 (e.g., MOS transistors, capacitor and resistor), and at least one of the lower metal lines 20L may include a via plug 24a connected to the conductive pattern 2.

Figure 32:
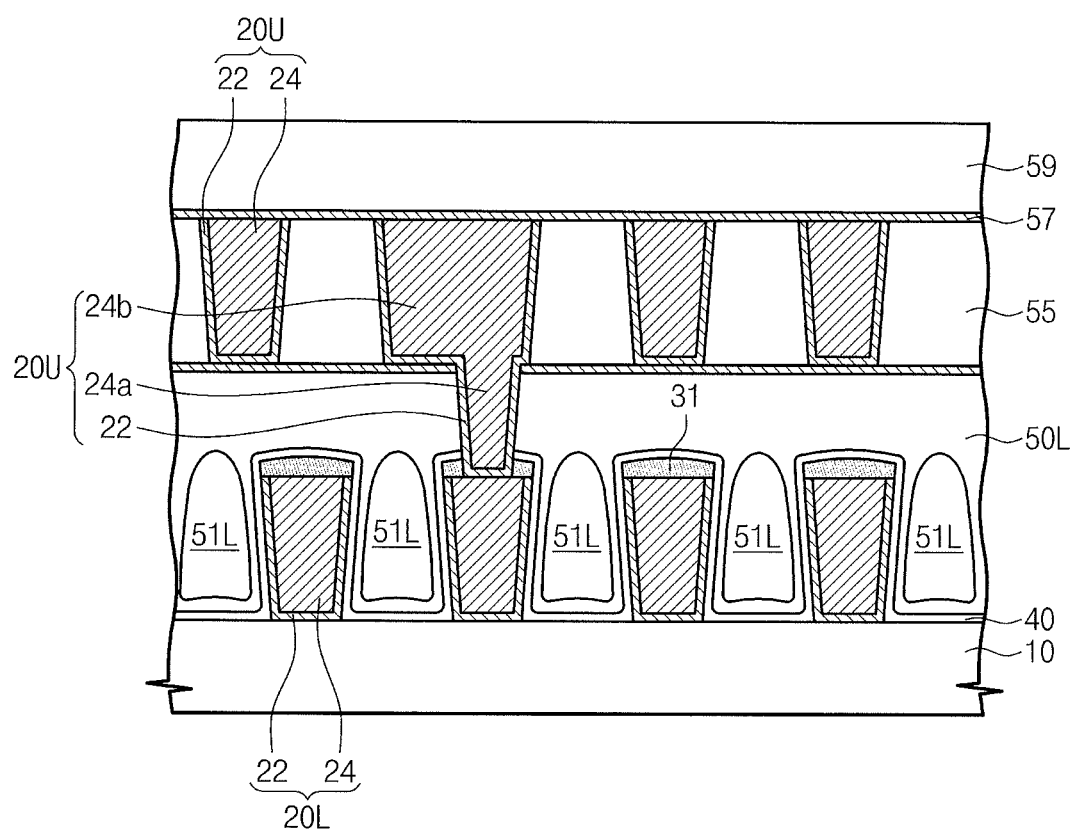
FIGS. 32 through 36 are sectional views illustrating semiconductor devices in which multi-layered interconnection structures formed by the fabrication methods according to various example embodiments of the present inventive concepts are provided.

In some example embodiments, as shown in FIG. 32, the upper metal lines 20U may be buried in an upper low-k dielectric 55, and a diffusion-barrier layer 57 may be formed on the upper low-k dielectric 55 to cover the top surfaces of the upper metal lines 20U. The diffusion-barrier layer 57 may protect/prevent metal atoms in metal lines vertically adjacent to each other from being diffused. An insulating layer 59 may be formed on the diffusion-barrier layer 57, and metal lines may be further formed on the insulating layer 59 in a similar manner to the lower and upper metal lines 20L and 20U.

Figure 33:
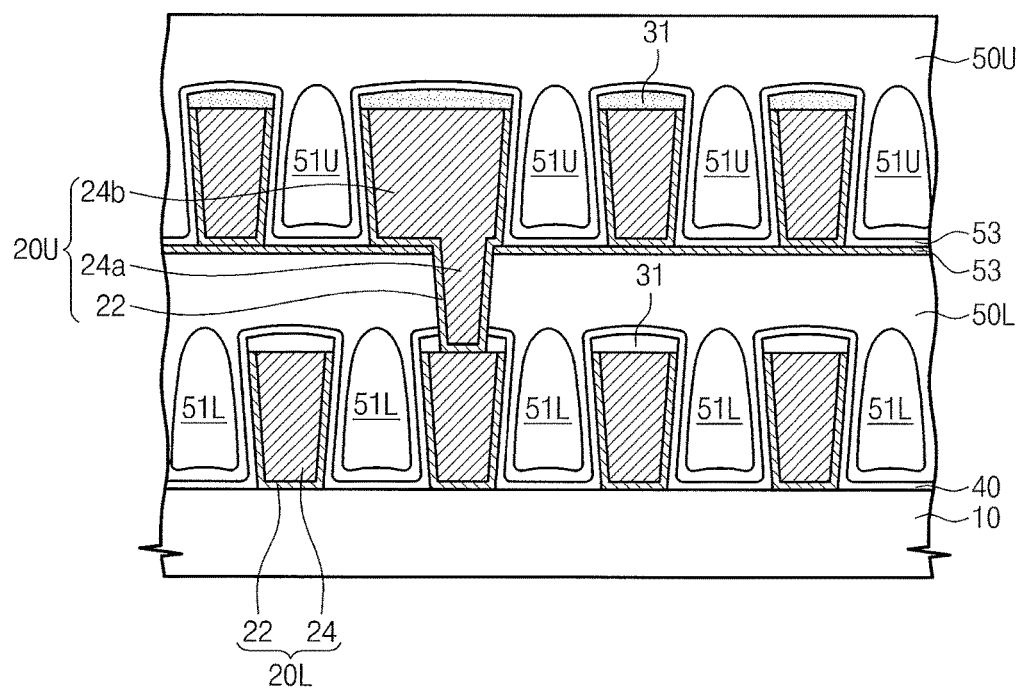
Figure 34:
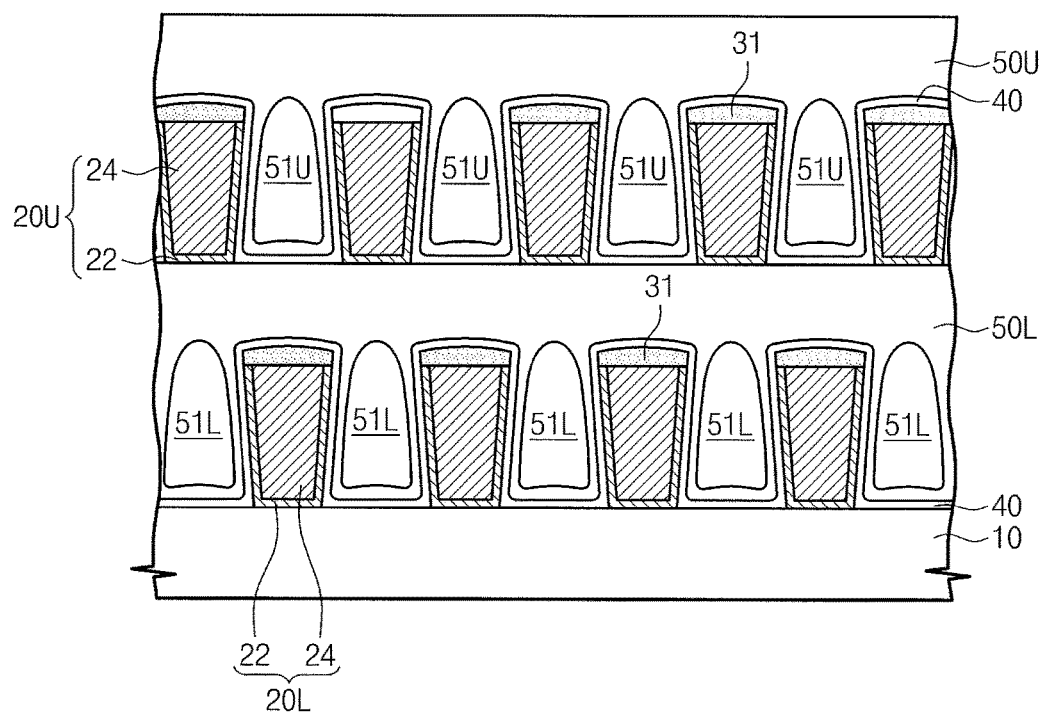

In some example embodiments, as shown in FIG. 33, similar to the lower metal lines 20L, the capping patterns 31 may be formed on the upper metal lines 20U, respectively. The capping patterns 31 may be formed of an insulating material having an etch selectivity with respect to the low-k dielectric, as described with reference to FIGS. 5 through 11, and the formation thereof may include forming a capping layer including first and second portions, whose chemical compositions are different from each other, and then, removing the second portion. The upper insulating layer 50U may be formed to cover the top surfaces of the upper capping patterns 31 and define the upper air gaps 51U between the upper metal lines 20U. According to some embodiments, the upper and lower metal lines 20U and 20L may be substantially the same in terms of line width and space. Accordingly, at least one pair of the upper air gap 51U and the lower air gap 51L may be overlapped with each other in plan view. Alternatively, the upper air gaps 51U and the lower air gaps 51L may be alternatingly formed in plan or sectional view; for example, in plan view, each of the upper air gaps 51U may be disposed at different positions from a corresponding one of the lower air gaps 51L, as shown in FIG. 34.

Figure 35:
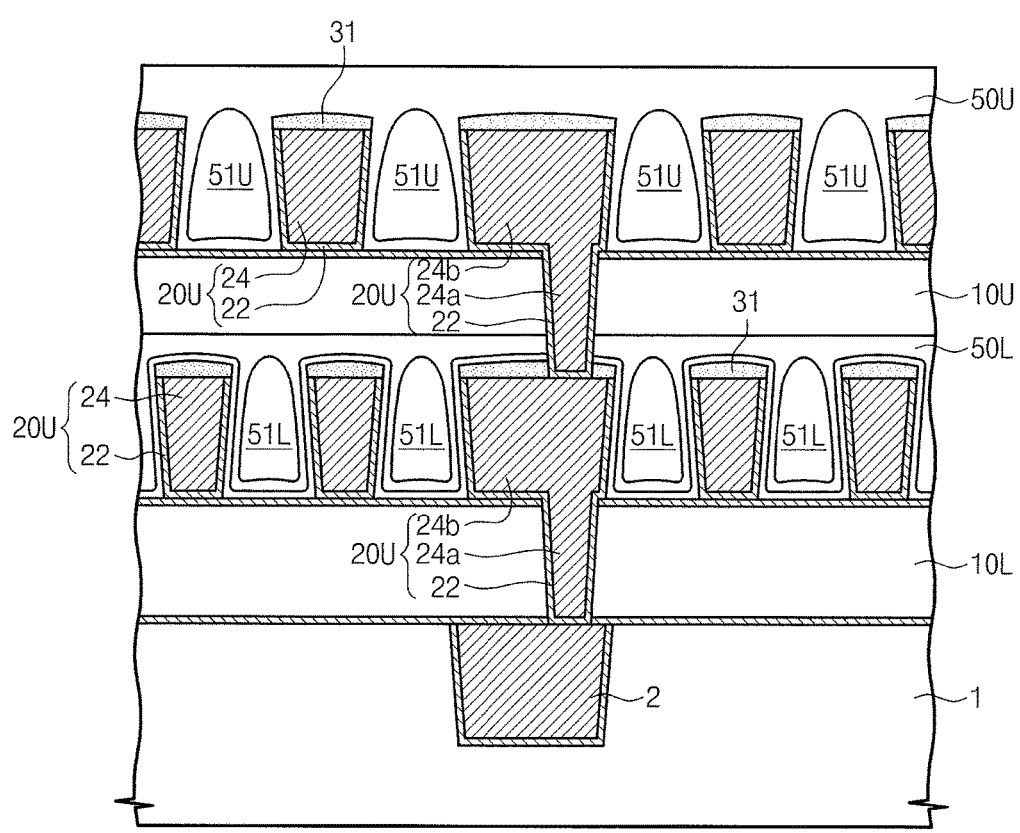

In some example embodiments, as shown in FIG. 35, the upper and lower metal lines 20U and 20L may be different from each other in terms of line width and space. Accordingly, the upper air gap 51U may be formed to have a width different from that of the lower air gap 51L.

Further, referring to FIG. 36, a lower low-k dielectric 10L may include a first region A, on which first lower metal lines 20L with high integration density will be disposed, and a second region B, on which second lower metal lines 20b with low integration density will be disposed. For example, the first lower metal lines 20L may be disposed to have a first space therebetween on the first region A, while the second lower metal lines 20b may be disposed on the second region B to have a second space therebetween larger than the first space.

According to some example embodiments of the present inventive concepts, the capping patterns 31L may be provided on the top surfaces of the first lower metal lines 20L. The capping patterns 31L may be formed of an insulating material having an etch selectivity with respect to the lower low-k dielectric 10L. As described with reference to FIGS. 5 through 11, the formation of the capping patterns 31L may include forming a capping layer including first and second portions, whose chemical compositions are different from each other, and then, removing the second portion.

A capping layer 30L may be formed on the second region B to cover the top surface of the lower low-k dielectric 10L and the second lower metal lines 20b. The capping layer 30L may include first portions 30a located on the top surface of the second lower metal lines 20b and second portions 30b located on the top surface of the lower low-k dielectric 10L. Here, the first portions 30a may be formed to have a chemical composition different from that of the second portions 30b. Further, the capping pattern 31L on the first region A may be formed of a material having substantially the same chemical composition as the first portion 30a of the capping layer 30L.

A lower insulating layer 50L may be disposed on the first and second lower metal lines 20L, 20b and a lower air gap 51L may be formed between the first lower metal lines 20L. The lower air gap 51L may be defined by the lower insulating layer 50L covering the first lower metal lines 20L. Alternatively, the lower air gap 51L may be defined by a porous insulating layer.

Before formation of the lower insulating layer 50L, a lower buffer insulating layer 40L may be formed to cover the sidewalls of the first lower metal lines 20L. Further, a lower insulating pattern 35L may be disposed on the capping layer 30L of the second region B, and the lower buffer insulating layer 40L may extend between the lower insulating layer 50L and the lower insulating pattern 35L.

Further, the first upper metal lines 20U may be spaced apart from each other on the lower insulating layer 50L of the first region A, and the second upper metal lines 20c may be spaced apart from each other on the lower insulating layer 50L of the second region B.

In some example embodiments, an upper low-k dielectric layer 10U may be disposed on the lower insulating layer 50L. The upper low-k dielectric layer 10U may have a recess region exposing a portion of the lower insulating layer 50L of the first region A. The first upper metal lines 20U may be disposed in the recess region of the upper low-k dielectric layer 10U and the second upper metal lines 20c may be buried in the upper low-k dielectric layer 10U of the second region B. At least one of the second upper metal lines 20c may include a barrier metal pattern 22, a via plug 24a and an interconnection 24b. For example, the via plug 24a of the second upper metal line 20c may penetrate the first portion 30a of the capping layer 30 covering the top surface of the second lower metal line 20b to be connected to the second lower metal line 20b.

Further, similar to the first lower metal lines 20L, the capping patterns 31U may be formed on the first upper metal lines 20U, respectively. The capping patterns 31U may be formed of an insulating material having an etch selectivity with respect to the low-k dielectric, as described with reference to FIGS. 5 through 11, and the formation thereof may include forming a capping layer including first and second portions, whose chemical compositions are different from each other, and then, removing the second portion.

Similar to the second lower metal lines 20L, a capping layer 30U may be formed on the second region B to cover the top surface of the upper low-k dielectric 10U and the second upper metal lines 20c. The capping layer 30U may include first portions 30a located on the top surface of the second upper metal lines 20c and second portions 30b located on the top surface of the upper low-k dielectric 10U. Further, the capping pattern 31U on the first upper metal lines 20U may be formed of a material having substantially the same chemical composition as the first portion 30a of the capping layer 30U.

An upper insulating layer 50U may be disposed on the first and second upper metal lines 20U, 20c, and an upper air gap 51U may be formed between the first upper metal lines 20U. The upper air gap 51U may be defined by the upper insulating layer 50U covering the first upper metal lines 20U. Alternatively, the upper air gap 51U may be defined by a porous insulating layer.

Before formation of the upper insulating layer 50U, an upper buffer insulating layer 40U may be formed to cover the sidewalls of the first upper metal lines 20U. Further, an upper insulating pattern 35U may be disposed on the capping layer 30U of the second region B, and the upper buffer insulating layer 40U may extend between the upper insulating layer 50U and the upper insulating pattern 35U.

Figure 37:
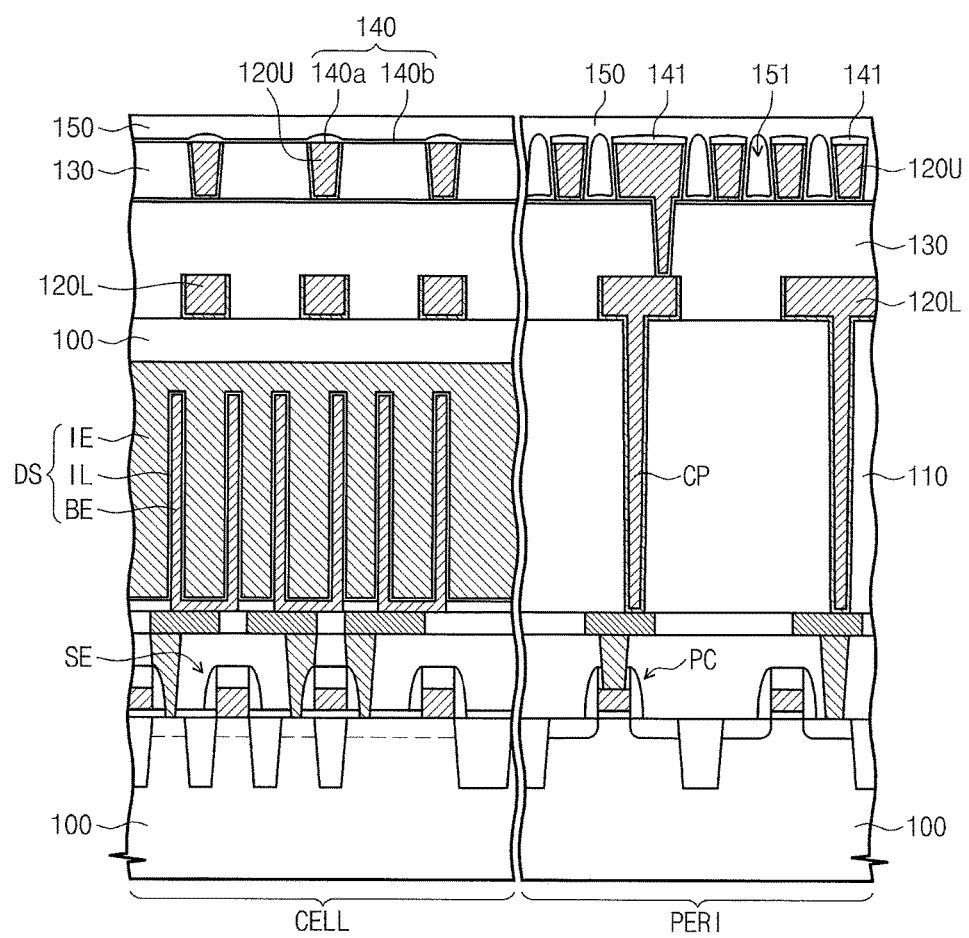
FIG. 37 is a sectional view illustrating an example of semiconductor memory devices fabricated by the fabrication methods according to various embodiments of the present inventive concepts.

FIG. 37 is a sectional view illustrating an example of semiconductor memory devices fabricated by the fabrication methods according to some embodiments of the present inventive concepts. Referring to FIG. 37, a semiconductor substrate 100 may include a cell region CELL to be formed with memory cells and a peripheral circuit region PERI to be formed with peripheral circuits controlling the memory cells.

Each of the memory cells on the cell region CELL may include a selection device SE and a data storing element DS. For example, the selection device SE may be a MOS transistor or diode. The data storing element DS may be a capacitor, a variable resistor, and so forth. The peripheral circuits PC (e.g., NMOS and PMOS transistors, diodes, or resistors) may be formed on the peripheral circuit region PERI to control the memory cells.

In some example embodiments, word lines and bit lines may be provided on the cell region CELL of the semiconductor substrate 100 to cross each other, and each of the data storing elements DS may be formed at the corresponding one of intersections between the word and bit lines. In example embodiment, the data storing element DS may include a capacitor with a lower electrode BE, an upper electrode IE, and a dielectric IL therebetween. The capacitor may be electrically connected to the selection devices SE through contact plugs. In some example embodiments, the lower electrodes BE of the capacitor may have a cylindrical or pillar-shaped structure. Here, a width of the lower electrode BE may decrease from top to bottom.

An interlayer insulating layer 110 may be formed on the semiconductor substrate 100 to cover the data storing elements DS and the peripheral circuits PC. A contact plug CP may be in the interlayer insulating layer 110. In some example embodiments, lower interconnection lines 120L may be disposed on the interlayer insulating layer 110. The lower interconnection lines 120L may be electrically connected to the data storing elements DS or the peripheral circuits PC. Similar to that described with reference to FIGS. 5 through 8, the formation of the lower interconnection lines 120L may include forming trenches in a low-k dielectric, and then, forming a barrier metal pattern and a metal pattern in the trench. A width of the lower interconnection line 120L on the cell region CELL may be different from that on the peripheral circuit region PERI. Further, a space between the lower interconnection lines 120L on the cell region CELL may be different from that on the peripheral circuit region PERI.

A low-k dielectric 130 may be formed on the interlayer insulating layer 110 to cover the lower interconnection lines 120L. Upper interconnection lines 120U may be formed on the low-k dielectric 130. The upper interconnection lines 120U may be electrically connected to the lower interconnection lines 120L through via plugs penetrating the low-k dielectric 130.

The upper interconnection lines 120U may be formed using the method of fabricating a semiconductor device, according to some example embodiments of the present inventive concepts. For example, capping patterns 141 made of an insulating material may be formed on the upper interconnection lines 120U, respectively.

In some example embodiments, the upper interconnection lines 120U on the cell region CELL may be buried in the low-k dielectric 130. For example, a gap region between the upper interconnection lines 120U on the cell region CELL may be filled with the low-k dielectric 130. By contrast, air gaps 151 may be formed between the upper interconnection lines 120U on the peripheral circuit region PERI. The air gaps 151 may be defined by an insulating layer 150 covering the upper interconnection lines 120U of the cell region CELL and the peripheral circuit region PERI. In some example embodiments, as shown in FIG. 24, the air gaps 151 may be defined by a porous insulating layer to be provided on the upper interconnection lines 120U.

According some embodiments, the air gaps 151 may be formed on the peripheral circuit region PERI, but example embodiments of the present inventive concepts may not be limited thereto. For example, the air gaps 151 may be formed on both of the cell region CELL and the peripheral circuit region PERI.

A capping layer 140 may be formed on the cell region CELL to cover the top surfaces of the low-k dielectric 130 and the upper interconnection lines 120U. Here, the capping layer 140 may include first portions 140a located on the upper interconnection lines 120U and second portions 140b located on the top surfaces of the low-k dielectric 130, and the first portions 140a may be formed to have a chemical composition different from that of the second portions 140b. Further, the capping pattern 141 on the peripheral circuit region PERI may be formed of a material having substantially the same chemical composition as the first portion 140a of the capping layer 140. In addition, the capping patterns 141 and the capping layer 140 may be formed of an insulating material having an etch selectivity with respect to the low-k dielectric 130. For example, the first portion 140a of the capping layer 140 and the capping pattern 141 may include a metal nitride layer, while the second portion 140b of the capping layer 140 may include a metal oxynitride layer or a metal oxide layer.

Figure 38:
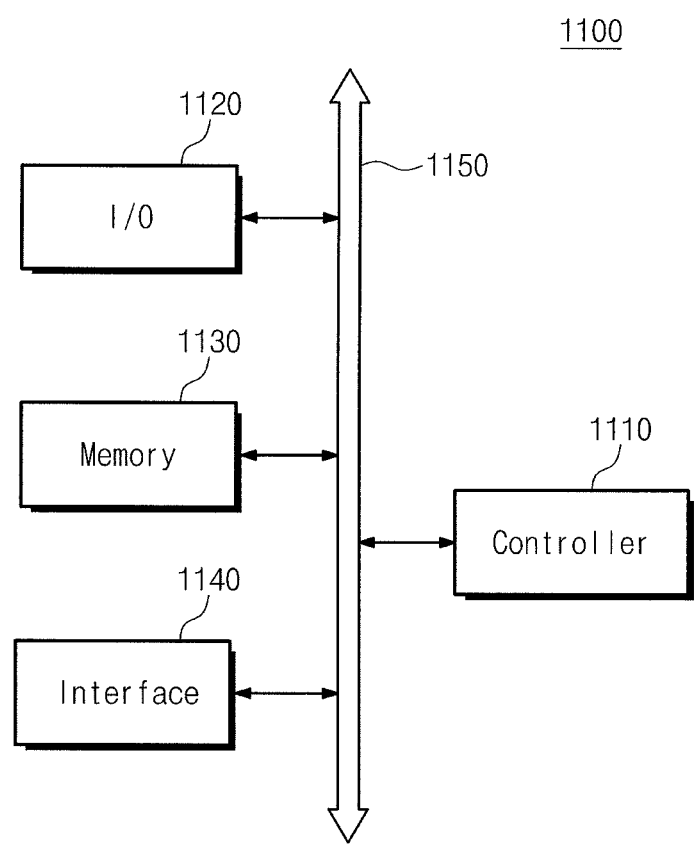
FIG. 38 is a schematic block diagram illustrating an example of electronic systems including a semiconductor device according to example embodiments of the present inventive concepts.

FIG. 38 is a schematic block diagram illustrating an example of electronic systems including a semiconductor device according to some example embodiments of the present inventive concepts. Referring to FIG. 38, an electronic system 1100 may include a controller 1110, an input-output (I/O) unit 1120, a memory device 1130, an interface 1140, and a bus 1150. The controller 1110, the input-output unit 1120, the memory device 1130 and/or the interface 1140 may be connected or coupled to each other via the bus 1150 serving as a pathway for data communication. At least one of the controller 1110, the input-output unit 1120, the memory device 1130, and/or the interface 1140 may include a semiconductor device according to example embodiments of the present inventive concepts.

The controller 1110 may include, e.g., at least one of a microprocessor, a digital signal processor, a microcontroller, or another logic device. The other logic device may have a similar function to any one of the microprocessor, the digital signal processor, and the microcontroller. The input-output unit 1120 may include a keypad, keyboard, a display device, and so forth. The memory device 1130 may be configured to store data and/or command. The interface unit 1140 may transmit electrical data to a communication network or may receive electrical data from a communication network. The interface unit 1140 may operate by wireless or cable. For example, the interface unit 1140 may include an antenna for wireless communication or a transceiver for cable communication. The electronic system 1100 may further include a fast DRAM device and/or a fast SRAM device which acts as a cache memory for improving an operation of the controller 1110.

The electronic system 1100 may be applied to, for example, a personal digital assistant (PDA), a portable computer, a web tablet, a wireless phone, a mobile phone, a digital music player, a memory card, or other electronic products. The other electronic products may receive or transmit information data by wireless.

Figure 39:
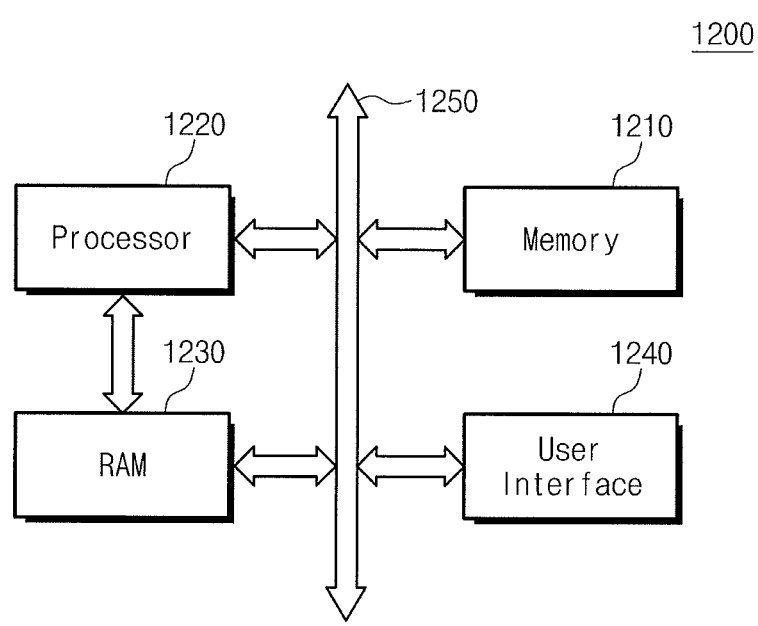
FIG. 39 is a schematic block diagram illustrating an example of electronic systems including a semiconductor memory device according to various embodiments of the present inventive concepts.

FIG. 39 is a schematic block diagram illustrating another example of electronic systems including a semiconductor memory device according to some embodiments of the present inventive concepts. Referring to FIG. 39, an electronic system 1200 may include at least one of the semiconductor memory devices according to various embodiments described herein. The electronic system 1200 may include a mobile device or a computer. As an illustration, the electronic system 1200 may include a memory system 1210, a processor 1220, a random access memory (RAM) 1230, and a user interface 1240 that that are electrically connected to a bus 1250. The processor 1220 may be configured to execute programs and control the electronic system 1200. The RAM 1230 may be used as an operating memory of the processor 1220. For example, all or each of the processor 1220 and the RAM 1230 may include the semiconductor device according to example embodiments of the present inventive concepts. Alternatively, the processor 1220 and the RAM 1230 may be provided as components of a semiconductor package. The user interface 1240 may be used to input/output data to/from the electronic system 1200. The memory system 1210 may be configured to store code for operating the processor 1220, data processed by the processor 1220 or data inputted from the outside. The memory system 1210 may include a controller and a memory device.

The electronic system 1200 may be realized as a mobile system, a personal computer, an industrial computer, or a logic system performing various functions. For example, the mobile system may be one of a personal digital assistant (PDA), a portable computer, a web tablet, a wireless phone, a mobile phone, a laptop computer, a digital music system, and an information transmit/receive system. When the electronic system 1200 performs wireless communication, the electronic system 1200 may be used in a communication interface protocol of a communication system such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, MMDS, and so forth.

According to example embodiments of the inventive concept, a capping layer may include a first portion covering a top surface of a metal line and a second portion covering a top surface of a low-k dielectric, and the first and second portions may be formed to have different chemical compositions from each other. The use of the capping layer makes it possible to realize a selective etching process, for which an additional etch mask is not required.

Further, the first portion of the capping layer may have a high etch selectivity with respect to the low-k dielectric, when the low-k dielectric is recessed to form an air gap between the metal lines. Accordingly, it may be possible to protect/prevent the metal lines from being unintentionally damaged or etched when the low-k dielectric is recessed. This makes it possible to protect/prevent the metal lines from having an increased resistance.

In addition, since the air gap between the metal lines has a dielectric constant of about 1, parasitic capacitance between the metal lines can be reduced, and thus, the semiconductor device can have an improved operation speed. Moreover, although air gaps have been discussed herein by way of example, any gap may be used according to various embodiments of the present disclosure. A gap may be defined, for example, as any void, cavity, or unobstructed space, and may be a gap filled with air (e.g., an air gap), a gap filled with an inert gas or gases (e.g., an inert gas gap), a gap defining a vacuum (e.g., a vacuum gap), etc.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A semiconductor device comprising:
   a plurality of lower metal lines spaced apart from each other on a low-k dielectric layer;
   a lower void between adjacent ones of the lower metal lines, the lower void having a first maximum width;
   a plurality of upper metal lines spaced apart from each other on the plurality of lower metal lines; and
   an upper void between adjacent ones of the upper metal lines, the upper void having a second maximum width that is greater than the first maximum width.

2. The device of claim 1,
   wherein the adjacent ones of the lower metal lines and the adjacent ones of the upper metal lines comprise copper.

3. The device of Claim 1, wherein each of the lower metal lines has a first width,
   wherein each of the upper metal lines has a second width that is different from the first width, and
   wherein the second width is greater than the first width.

4. The device of claim 1, wherein each of the lower metal lines has a first lower width smaller than a first upper width, and
   wherein each of the upper metal lines has a second lower width smaller than a second upper width.

5. The device of claim 1, wherein the upper metal lines are misaligned with the lower metal lines.

6. The device of claim 1, wherein a width of the lower void decreases from bottom to top.

7. The device of claim 1, wherein the upper void is misaligned with the lower void.

8. The device of claim 1, wherein a highest point of the upper void is higher than surfaces of the upper metal lines.

9. The device of claim 1, wherein the plurality of lower metal lines comprise a plurality of first lower metal lines and a plurality of second lower metal lines,
   wherein the lower void is located between adjacent ones of the first lower metal lines, and
   wherein a space between adjacent ones of the second lower metal lines is filled with the low-k dielectric layer.

10. The device of claim 9, wherein the first lower metal lines are spaced apart by a first distance, and wherein the second lower metal lines are spaced apart by a second distance that is greater than the first distance.

11. The device of claim 1, wherein each of the lower metal lines comprises:
    a barrier metal pattern;

a metal pattern on the barrier metal pattern; and a capping pattern covering a top surface of the barrier metal pattern and a top surface of the metal pattern.

12. The device of claim 11, wherein a highest point of the lower void is higher than top surfaces of the capping patterns of the lower metal lines.

13. The device of claim 11, wherein the capping pattern comprises a material having an etch selectivity with respect to the low-k dielectric layer.

14. The device of claim 1, further comprising a buffer insulating layer conformally covering top surfaces and sidewalls of the lower metal lines, wherein the buffer insulating layer defines the lower void.

15. A semiconductor device comprising:
a plurality of lower metal lines spaced apart from each other on a low-k dielectric layer, each of the lower metal lines having a first lower width smaller than a first upper width;
a lower void between adjacent ones of the lower metal lines, the lower void having a first maximum width;
a plurality of upper metal lines spaced apart from each other on the plurality of lower metal lines, each of the upper metal lines having a second lower width smaller than a second upper width; and
an upper void between adjacent ones of the upper metal lines, the upper void having a second maximum width that is greater than the first maximum width.

16. The device of claim 15, wherein the first upper width is different from the second upper width.

17. The device of claim 15, wherein a width of the lower void decreases from bottom to top.

18. The device of claim 15, wherein the upper void is misaligned with the lower void.

19. The device of claim 15, wherein the plurality of lower metal lines comprise a plurality of first lower metal lines and a plurality of second lower metal lines, wherein the lower void is located between adjacent ones of the first lower metal lines, and wherein a space between adjacent ones of the second lower metal lines is filled with the low-k dielectric layer.

20. The device of claim 1, wherein each of the lower metal lines comprises:
a barrier metal pattern;
a metal pattern on the barrier metal pattern; and
a capping pattern covering a top surface of the barrier metal pattern and a top surface of the metal pattern, and
wherein a highest point of the lower void is higher than top surfaces of the capping patterns of the lower metal lines.

* * * * *